United States Patent
Kim et al.

(10) Patent No.: US 9,583,697 B2
(45) Date of Patent: Feb. 28, 2017

(54) MAGNETIC MEMORY DEVICES AND METHODS OF FORMING THE SAME

(71) Applicants: Keewon Kim, Suwon-si (KR); Minah Kang, Seoul (KR); Soonoh Park, Suwon-si (KR); Yong Sung Park, Suwon-si (KR); Sechung Oh, Yongin-si (KR)

(72) Inventors: Keewon Kim, Suwon-si (KR); Minah Kang, Seoul (KR); Soonoh Park, Suwon-si (KR); Yong Sung Park, Suwon-si (KR); Sechung Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/716,913

(22) Filed: May 20, 2015

(65) Prior Publication Data

US 2016/0049581 A1 Feb. 18, 2016

(30) Foreign Application Priority Data

Aug. 14, 2014 (KR) ........................ 10-2014-0106110

(51) Int. Cl.
*H01L 43/08* (2006.01)
*G11C 11/16* (2006.01)
(Continued)

(52) U.S. Cl.
CPC ............ *H01L 43/08* (2013.01); *G11C 11/161* (2013.01); *H01L 27/228* (2013.01); *H01L 43/02* (2013.01); *H01L 43/10* (2013.01); *H01L 43/12* (2013.01)

(58) Field of Classification Search
CPC ......... H01L 43/08; H01L 43/02; H01L 43/10; H01L 43/12; H01L 27/228; H01L 45/04;
(Continued)

(56) References Cited

U.S. PATENT DOCUMENTS

| 6,783,999 B1 | 8/2004 | Lee |
| 8,163,569 B2 | 4/2012 | Nam et al. |

(Continued)

FOREIGN PATENT DOCUMENTS

| JP | 2005123298 A | 5/2005 |
| KR | 20030002141 A | 1/2003 |

(Continued)

*Primary Examiner* — Jarrett Stark
*Assistant Examiner* — Bitew Dinke
(74) *Attorney, Agent, or Firm* — Myers Bigel, P.A.

(57) ABSTRACT

The inventive concepts provide magnetic memory devices and methods forming the same. The method includes sequentially forming a first magnetic conductive layer and a capping layer on a substrate, patterning the capping layer and the first magnetic conductive layer to form a first magnetic conductive pattern and a capping pattern, forming an interlayer insulating layer exposing the capping pattern on the substrate, removing the capping pattern to expose the first magnetic conductive pattern, forming a tunnel barrier layer and a second magnetic conductive layer on the first magnetic conductive pattern and the interlayer insulating layer, and patterning the second magnetic conductive layer and the tunnel barrier layer to form a second magnetic conductive pattern and a tunnel barrier pattern.

20 Claims, 22 Drawing Sheets

(51) Int. Cl.
*H01L 43/02* (2006.01)
*H01L 43/12* (2006.01)
*H01L 43/10* (2006.01)
*H01L 27/22* (2006.01)

(58) Field of Classification Search
CPC ..... H01L 45/06; H01L 27/105; H01L 27/101; G11C 11/161
See application file for complete search history.

(56) References Cited

U.S. PATENT DOCUMENTS

| | | | |
|---|---|---|---|
| 8,465,990 B2 | 6/2013 | Matsui et al. | |
| 8,587,043 B2 | 11/2013 | Natori et al. | |
| 8,975,089 B1* | 3/2015 | Jung | H01L 43/12 257/295 |
| 2012/0007196 A1* | 1/2012 | Natori | H01L 27/228 257/421 |
| 2012/0230091 A1* | 9/2012 | Yanagi | B82Y 25/00 365/158 |
| 2012/0244639 A1* | 9/2012 | Ohsawa | H01L 43/12 438/3 |
| 2013/0040408 A1* | 2/2013 | Nam | H01L 21/76897 438/3 |
| 2013/0043530 A1* | 2/2013 | Kim | H01L 27/105 257/334 |
| 2013/0069186 A1* | 3/2013 | Toko | H01L 43/08 257/425 |
| 2013/0171743 A1* | 7/2013 | Lee | H01L 43/12 438/3 |
| 2013/0234268 A1* | 9/2013 | Kariyada | H01L 43/08 257/421 |
| 2014/0021566 A1* | 1/2014 | Park | H01L 43/02 257/421 |
| 2014/0206106 A1* | 7/2014 | Takahashi | H01L 27/228 438/3 |
| 2014/0210021 A1* | 7/2014 | Zhu | G11C 11/15 257/421 |
| 2014/0281231 A1* | 9/2014 | Lee | H01L 43/02 711/118 |
| 2015/0069550 A1* | 3/2015 | Sugiura | H01L 43/08 257/421 |
| 2015/0123223 A1* | 5/2015 | Kim | H01L 43/08 257/421 |
| 2015/0249206 A1* | 9/2015 | Kim | H01L 43/08 257/421 |

FOREIGN PATENT DOCUMENTS

| | | |
|---|---|---|
| KR | 20030078136 A | 10/2003 |
| KR | 20040060312 A | 7/2004 |

* cited by examiner

MAGNETIC MEMORY DEVICES AND METHODS OF FORMING THE SAME

CROSS-REFERENCE TO RELATED APPLICATION

This U.S. non-provisional patent application claims priority under 35 U.S.C. §119 to Korean Patent Application No. 10-2014-0106110, filed on Aug. 14, 2014, in the Korean Intellectual Property Office, the disclosure of which is hereby incorporated by reference in its entirety.

BACKGROUND

The inventive concepts relate to magnetic memory devices and method of forming the same.

Semiconductor devices are widely used in an electronic industry because of their small sizes, multi-functions, and low manufacture costs. Semiconductor devices may include semiconductor memory devices storing logic data, semiconductor logic devices processing logic data, and/or system-on-chips (SOCs) of which each includes a memory element and a logic element.

As semiconductor devices have been highly integrated with the development of the electronic industry, various problems have been caused. For example, a margin of a manufacturing process may be reduced and a resistance of a resistance of a unit cell of a semiconductor memory device may increase. Thus, various researches are conducted for solving these problems.

SUMMARY

Embodiments of the inventive concepts may provide magnetic memory devices capable of improving characteristics of a magnetic tunnel junction. Some embodiments are directed to semiconductor devices that include a contact plug pattern in a first interlayer dielectric layer formed on a substrate, top surfaces of the contact plug pattern and the first interlayer dielectric layer being substantially coplanar, a first electrode pattern on the contact plug pattern and conductively coupled to the contact plug pattern, a first magnetic conductive pattern on the first electrode pattern, a second magnetic conductive pattern on the first magnetic conductive pattern, a tunnel barrier pattern between the first magnetic conductive pattern and the second magnetic conductive pattern and having a first surface on which the second magnetic conductive pattern is formed and a second surface that is opposite the first surface and a metal oxide layer on a portion of the second surface of the tunnel barrier pattern that does not contact the first magnetic conductive pattern and on a side surface of the first magnetic conductive pattern.

In some embodiments, the first magnetic conductive pattern comprises a first portion that includes a portion of a first magnetic layer and a second portion that includes a portion of a magnetic recovery layer. Some embodiments provide that the magnetic recovery layer comprises a same material as the first magnetic conductive pattern and a reduced concentration of Boron (B) relative to the first magnetic conductive pattern. In some embodiments, a portion of the magnetic recovery layer comprises an insulating material. Some embodiments provide that the magnetic recovery layer includes a thickness in a range of about 1 Å to about 10 Å. In some embodiments, the magnetic recovery layer includes a thickness in a range of about 1 Å to about 5 Å.

Some embodiments include a second interlayer dielectric pattern on the first interlayer dielectric layer. In some embodiments, the metal oxide layer is on the second interlayer dielectric layer and includes an oxide of a magnetic conductive layer and the second interlayer dielectric layer includes a non-metallic oxide, a non-metallic nitride and/or a non-metallic oxynitride. Some embodiments provide that the non-metallic oxide, the non-metallic nitride and/or the non-metallic oxynitride comprise silicon oxide, silicon nitride and/or silicon oxynitride.

Some embodiments include a second electrode pattern on the second magnetic conductive pattern. In some embodiments, widths of the second electrode pattern, the second magnetic conductive pattern and the tunnel barrier pattern are greater than widths of the first electrode pattern and the first magnetic conductive pattern.

Some embodiments include an insulating spacer on side walls of the first electrode pattern and the first magnetic conductive pattern. In some embodiments, the second magnetic conductive pattern includes a first pinned magnetic conductive pattern on the tunnel barrier pattern, an exchange coupling pattern on the first pinned pattern and a second pinned magnetic conductive pattern on the exchange coupling pattern.

Some embodiments of the inventive concepts are directed to methods of forming a magnetic memory device. Such methods may include forming a lower interlayer dielectric layer on a first surface of a substrate that includes a conductive region, forming a contact plug in the lower interlayer dielectric layer and being conductively coupled to the conductive region, sequentially forming a bottom electrode layer and a first magnetic conductive layer on the lower interlayer dielectric layer, the bottom electrode layer being conductively coupled to the contact plug, forming a capping layer on the first magnetic conductive layer, and patterning the bottom electrode layer, the first magnetic conductive layer and the capping layer to form a bottom electrode pattern, a first magnetic conductive pattern and a capping pattern, respectively, each having a first width in a direction that is substantially parallel to the first surface of the substrate. Methods may further include forming an upper interlayer dielectric layer on the lower interlayer dielectric layer, the upper interlayer dielectric layer and a top surface of the capping pattern being coplanar, performing an etching process to remove the capping pattern and a portion of the upper interlayer dielectric layer, forming a tunnel barrier layer on the upper interlayer dielectric layer and the first magnetic conductive pattern, forming a second magnetic conductive layer on the tunnel barrier layer and patterning the tunnel barrier layer and the second magnetic conductive layer to form a tunnel barrier pattern and a second magnetic conductive pattern, respectively, having a second width that is greater than the first width. In some embodiments, performing the etching process to remove the capping pattern is performed in a vacuum.

In some embodiments, forming the capping layer comprises forming a first sub-capping layer having that includes at least one of ruthenium (Ru), rhodium (Rh), palladium (Pd), silver (Ag), rhenium (Re), osmium (Os), iridium (Ir), platinum (Pt), gold (Au), copper (Cu), and/or any combination thereof. Some embodiments provide that the first sub-capping layer is doped with an amorphization element that includes at least one of boron (B), carbon (C), beryllium (Be), silicon (Si), phosphorus (P), germanium (Ge), selenium (Se), zirconium (Zr), antimony (Sb), tellurium (Te), and/or hafnium (Hf). In some embodiments, forming the capping layer further comprises forming a second sub-capping layer that is between the first magnetic conductive layer and the first sub-capping layer that includes at least one of magnesium (Mg), magnesium-titanium (MgTi), titanium (Ti), boron (B), silicon (Si), chrome (Cr), zirconium (Zr), hafnium (Hf), tantalum (Ta), aluminum (Al), Tungsten (W) and/or an oxide and/or nitride thereof.

Some embodiments provide that forming the second magnetic conductive layer comprises forming a first pinned magnetic conductive layer on the tunnel barrier layer, forming an exchange coupling layer on the first pinned layer and forming a second pinned magnetic conductive layer on the exchange coupling layer.

Some embodiments include applying a vacuum break condition after forming the capping layer and before forming the second magnetic conductive layer.

Some embodiments include, before patterning the tunnel barrier layer and the second magnetic conductive layer, forming a top electrode layer on the upper magnetic conductive layer. In some embodiments, patterning the tunnel barrier layer and the second magnetic conductive layer comprises patterning the tunnel barrier layer, the second magnetic conductive layer and the top electrode layer to form the tunnel barrier pattern, the second magnetic conductive pattern and a top electrode pattern, respectively.

Some embodiments include forming an insulating spacer on side walls of the first electrode pattern and the first magnetic conductive pattern. In some embodiments, the insulating spacer comprises an oxide of a magnetic conductive layer.

Some embodiments provide that performing the etching process to remove the capping pattern and forming the tunnel barrier layer are sequentially performed in a same chamber environment.

Some embodiments include, before forming the tunnel barrier layer, forming a magnetic recovery layer that includes a same material as the first magnetic conductive pattern and a reduced concentration of Boron (B) relative to the first magnetic conductive layer. In some embodiments, patterning the tunnel barrier layer and the second magnetic conductive layer further comprises patterning the magnetic recovery layer to form a magnetic recovery pattern having the second width. Some embodiments include performing a heat treatment to convert an exposed portion of the magnetic recovery layer from a conductive material to an insulating material. In some embodiments, the magnetic recovery layer includes a thickness from about 1 Å to about 10 Å. In some embodiments, the magnetic recovery layer includes a thickness from about 1 Å to about 5 Å.

Some embodiments provide that the upper interlayer dielectric layer includes a non-metallic oxide, a non-metallic nitride and/or a non-metallic oxynitride.

Some embodiments of the present inventive concept are directed to methods of forming a magnetic memory device. Such method may include sequentially forming a first magnetic conductive layer and a capping layer on a substrate, patterning the capping layer and the first magnetic conductive layer to form a first magnetic conductive pattern and a capping pattern having a first width, forming an interlayer insulating layer exposing the capping pattern on the substrate, removing the capping pattern to expose the first magnetic conductive pattern, forming an insulating spacer on side walls of the first magnetic conductive pattern, forming a tunnel barrier layer and a second magnetic conductive layer on the first magnetic conductive pattern and the interlayer insulating layer, and patterning the second magnetic conductive layer and the tunnel barrier layer to form a second magnetic conductive pattern and a tunnel barrier pattern having a second width that is greater than the first width.

Some embodiments include, before forming the tunnel barrier layer, forming a magnetic recovery layer that includes a same material as the first magnetic conductive pattern and a reduced concentration of Boron (B) relative to the first magnetic conductive layer. In some embodiments, patterning the second magnetic conductive layer and the tunnel barrier layer further comprises patterning the magnetic recovery layer to form a magnetic recovery pattern. Some embodiments include performing a heat treatment to convert an exposed portion of the magnetic recovery layer from a conductive material to an insulating material. In some embodiments, the magnetic recovery layer includes a thickness from about 1 Å to about 5 Å.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The inventive concepts will become more apparent in view of the attached drawings and accompanying detailed description.

DETAILED DESCRIPTION

Figure 1:
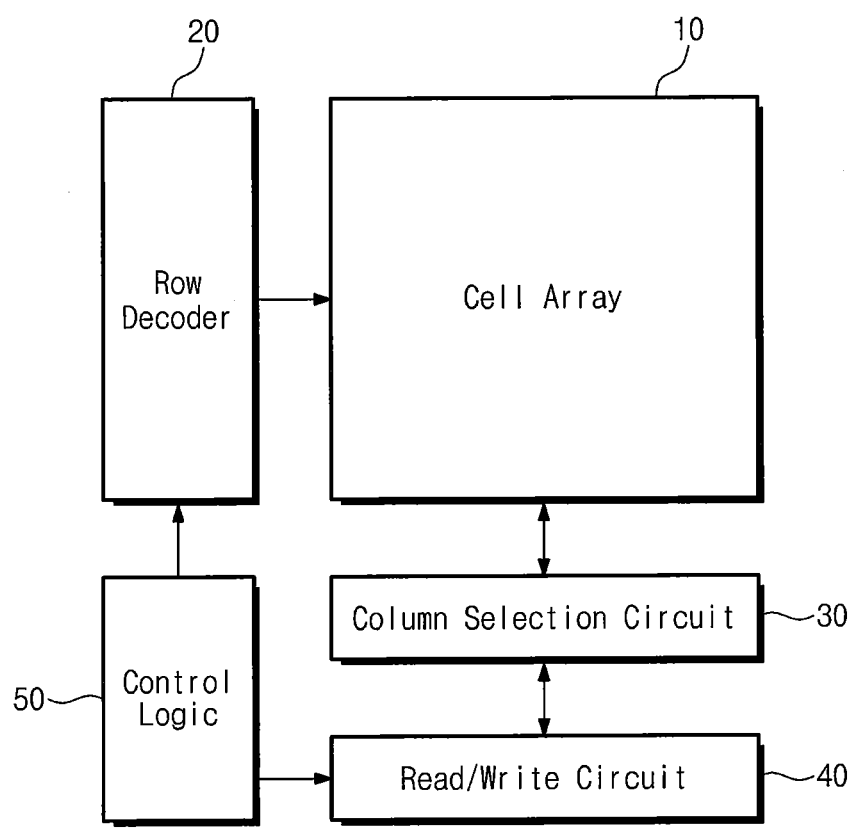
FIG. 1 is a schematic block diagram illustrating a magnetic memory device according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a magnetic memory device according to example embodiments of the inventive concepts.

Referring to FIG. 1, a magnetic memory device may include a memory cell array 10, a row decoder 20, a column selection circuit 30, a read/write circuit 40, and a control logic circuit 50.

The memory cell array 10 may include a plurality of word lines, a plurality of bit lines, and memory cells connected to intersecting points of the word lines and the bit lines. A structure of the memory cell array 10 will be described in more detail with reference to FIG. 8.

The row decoder 20 may be connected to the memory cell array 10 through the word lines. The row decoder 20 may decode an address signal inputted from an external system to select one of the word lines.

The column selection circuit 30 may be connected to the memory cell array 10 through the bit lines and may decode an address signal inputted from the external system to select one of the bit lines. The bit line selected by the column selection circuit 30 may be connected to the read/write circuit 40.

The read/write circuit 40 may provide a bit line bias for accessing a selected memory cell in response to a control signal of the control logic circuit 50. The read/write circuit 40 may provide a bit line voltage to the selected bit line, so inputted data may be written in the memory cell or data may be sensed from the memory cell.

The control logic circuit 50 may output control signals, which control a semiconductor memory device, in response to command signals provided from the external system. The control signals outputted from the control logic circuit 50 may control the read/write circuit 40.

FIGS. 2 to 8 are cross-sectional views illustrating methods of forming a magnetic memory device according to some embodiments of the inventive concepts.

Figure 2:
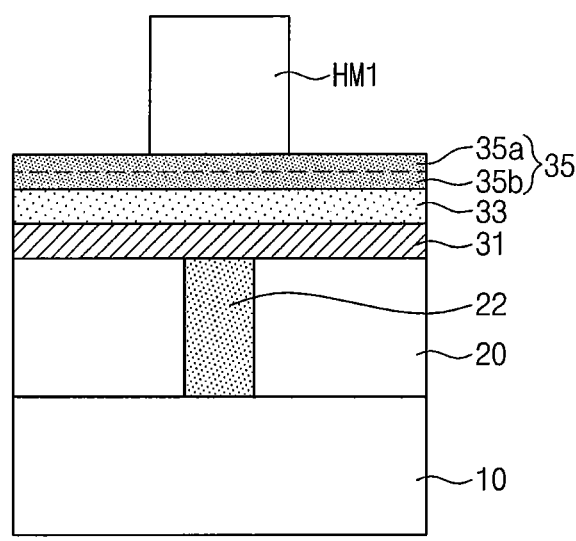
FIGS. 2 to 8 are cross-sectional views illustrating a method of forming a magnetic memory device according to some embodiments of the inventive concepts.

Referring to FIG. 2, a substrate 10 is provided. The substrate 10 may be a silicon substrate, a germanium substrate, and/or a silicon-germanium substrate. The substrate 10 may have a conductive region (not shown).

A lower interlayer insulating layer 20 may be formed on the substrate 10. The lower interlayer insulating layer 20 may be formed of oxide (e.g., silicon oxide), nitride (e.g., silicon nitride), and/or oxynitride (e.g., silicon oxynitride). A contact plug 22 that is connected to the conductive region (not shown) may be formed in the lower interlayer insulating layer 20. The contact plug 22 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide).

A bottom electrode layer 31 may be formed on a lower interlayer insulating layer 20. The bottom electrode layer 31 may overlap with the contact plug 22 and may be connected to the contact plug 22. The bottom electrode layer 31 may include at least one of conductive metal nitride (e.g., titanium nitride and/or tantalum nitride), transition metal (e.g., titanium and/or tantalum), and/or rare-earth metal (e.g., ruthenium and/or platinum).

A first magnetic conductive layer 33 may be formed on the bottom electrode layer 31. The first magnetic conductive layer 33 may have a thickness of about 50 Å. The first magnetic conductive layer 33 may have a changeable magnetization direction. The first magnetic conductive layer 33 may include a ferromagnetic material and may have the magnetization direction parallel to a top surface of the substrate 10. In this case, the first magnetic conductive layer 33 may include at least one of iron and cobalt. For example, the first magnetic conductive layer 33 may include at least one of cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). In some embodiments, the magnetization direction of the first magnetic conductive layer 33 may be substantially perpendicular to the top surface of the substrate 10. In this case, the first magnetic conductive layer 33 may include a perpendicular magnetic material (e.g., CoFeTb, CoFeGd, CoFeDy, and/or CoTb), a perpendicular magnetic material having a $L1_0$ structure, cobalt-platinum (CoPt) having a hexagonal close packed (HCP) lattice structure, or a multi-layered structure (e.g., Co/Pt or Co/Pd). Here, the perpendicular magnetic material having the $L1_0$ structure may include at least one of iron-platinum (FePt) of the $L1_0$ structure, iron-palladium (FePd) of the $L1_0$ structure, cobalt-palladium (CoPd) of the $L1_0$ structure, and/or cobalt-platinum (CoPt) of the $L1_0$ structure.

A capping layer 35 may be formed on the first magnetic conductive layer 33. The capping layer 35 may protect the first magnetic conductive layer 33 disposed under the capping layer 35. The capping layer 35 may include a first sub-capping layer 35a. A thickness of the first sub-capping layer 35a may be in a range of about 10 Å to about 20 Å. The first sub-capping layer 35a may include noble metal having resistance to oxidation and corrosion. For example, the first sub-capping layer 35a may include at least one of ruthenium (Ru), rhodium (Rh), palladium (Pd), silver (Ag), rhenium (Re), osmium (Os), iridium (Ir), platinum (Pt), gold (Au), copper (Cu), and/or any alloy thereof. In addition, the first sub-capping layer 35a may be additionally doped with an amorphization element (e.g., boron (B), carbon (C), beryllium (Be), silicon (Si), phosphorus (P), germanium (Ge), selenium (Se), zirconium (Zr), antimony (Sb), tellurium (Te), and/or hafnium (Hf)). Thus, the first sub-capping layer 35a may have an amorphous phase to improve protection ability of the first sub-capping layer 35a to the first magnetic conductive layer 33. The capping layer 35 may further include a second sub-capping layer 35b disposed between the first magnetic conductive layer 33 and the first sub-capping layer 35a. The second sub-capping layer 35b may be formed before the formation of the first sub-capping layer 35a. The second sub-capping layer 35b may include an oxide or nitride of at least one of magnesium (Mg), magnesium-titanium (MgTi), titanium (Ti), boron (B), silicon (Si), chrome (Cr), zirconium (Zr), hafnium (Hf), tantalum (Ta), and/or aluminum (Al). The second sub-capping layer 35b may prevent a material of the first sub-capping layer 35a from permeating into the first magnetic conductive layer 33 during a subsequent process. A thickness of the second sub-capping layer 35b may be in a range of about 10 Å to about 20 Å. A first mask pattern HM1 may be formed on the capping layer 35.

Figure 3:
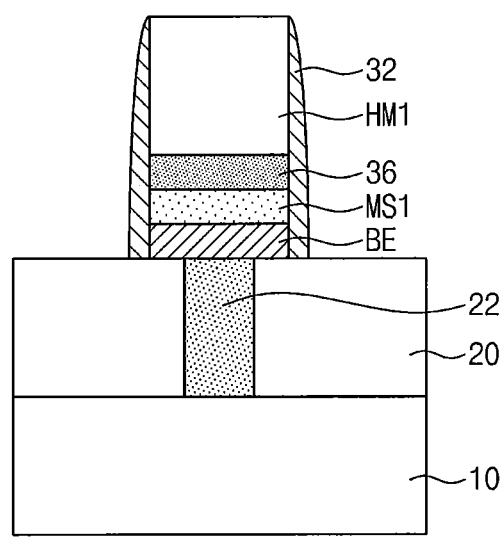

Referring to FIG. 3, the capping layer 35, the first magnetic conductive layer 33, and the bottom electrode layer 31 may be sequentially patterned by an etching process using the first mask pattern HM1 to form a capping pattern 36, a lower magnetic conductive pattern MS1, and a bottom electrode BE. The lower magnetic conductive pattern MS1 may be a free layer. The etching process may be a dry etching process. The first mask pattern HM1 may include silicon nitride.

In some embodiments, the thickness of the first magnetic conductive layer 33 corresponding to the free layer may be smaller than that of a second magnetic conductive layer 50 described below. Thus, when the etching process is performed to form the lower magnetic conductive pattern MS1, a burden of the etching process may be reduced and the amount of an etch byproduct may be reduced.

In some embodiments, after the etching process is performed, an insulating side wall spacer 32 may be formed on side surfaces of the first mask pattern HM1, the capping pattern 36, the lower magnetic conductive pattern MS1 and the bottom electrode BE. Some embodiments provide that the insulating side wall spacer may include a metal oxide, an oxide (e.g., silicon oxide), nitride (e.g., silicon nitride), and/or oxynitride (e.g., silicon oxynitride).

Figure 4:
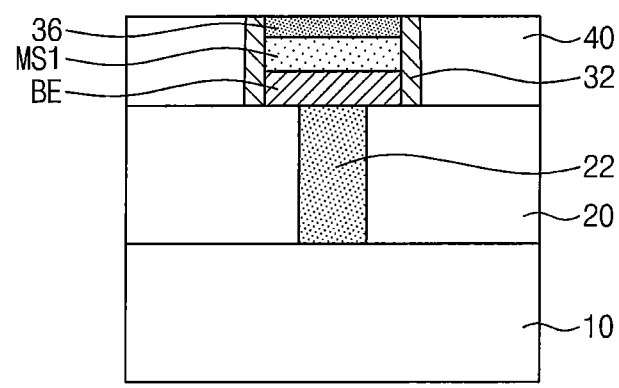

Referring to FIG. 4, an upper interlayer insulating layer 40 may be formed to cover the capping pattern 36, the lower magnetic conductive pattern MS1, and the bottom electrode BE. Some non-limiting embodiments provide that the upper insulating side wall spacer 32 may be covered by the upper interlayer insulating layer. The upper interlayer insulating layer 40 may be formed of oxide (e.g., silicon oxide), nitride (e.g., silicon nitride), and/or oxynitride (e.g., silicon oxynitride). The upper interlayer insulating layer 40 may be planarized to expose the capping pattern 36 and/or top surfaces of the insulating side wall spacer 32. The upper interlayer insulating layer 40 may be planarized using a chemical mechanical polishing (CMP) process. The capping pattern 36, the lower magnetic conductive pattern MS1, and the bottom electrode BE may be exposed in the atmosphere during the etching process and the CMP process. During this exposure, the capping pattern 36 may prevent a top surface of the lower magnetic conductive pattern MS1 from being oxidized to generate a rough oxide layer.

If the capping pattern 36 does not exist, the top surface of the lower magnetic conductive pattern MS1 may be oxidized to have a surface roughness of 10 Å RMS (root mean square). However, according to the inventive concepts, the top surface of the lower magnetic conductive pattern MS1 may be hardly oxidized due to the capping pattern 36. Thus, the top surface of the lower magnetic conductive pattern MS1 according to the inventive concepts may have a surface roughness of 5 Å RMS or less. This will be described in detail later.

Figure 5:
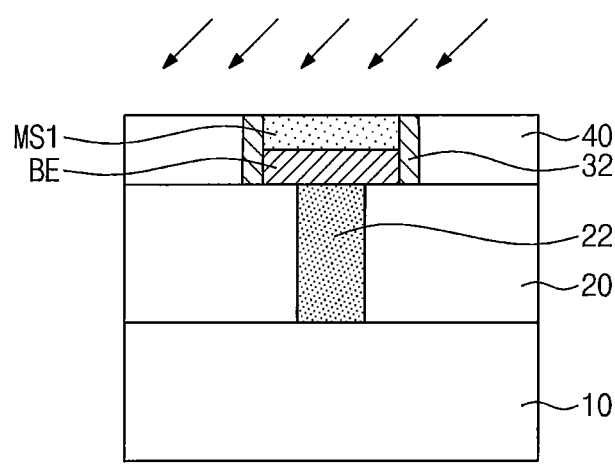

Referring to FIG. 5, the capping pattern 36 may be removed in a high vacuum (e.g., about $10^{-8}$ Torr). Removing the capping pattern 36 may include a physical etching process that uses an ion beam or plasma in a vacuum. An inert gas (e.g., argon (Ar), helium (He), neon (Ne), krypton (Kr), and/or xenon (Xe)) may be used as an etching gas when the capping pattern 36 is removed. Hydrogen ($H_2$) gas, oxygen ($O_2$) gas, nitrogen ($N_2$) gas, and/or fluorocarbon ($CF_x$) gas may be added to the etching gas. The lower magnetic conductive pattern MS1 may be exposed by the removal of the capping pattern 36. At this time, the lower magnetic conductive pattern MS1 may have a damaged top surface. In some embodiments, if the lower magnetic conductive pattern MS1 includes cobalt-iron-boron (CoFeB), an upper portion of the lower magnetic conductive pattern MS1 may contain an excessive amount of boron (B). This is because cobalt (Co) and/or iron (Fe) of the upper portion of the lower magnetic conductive pattern MS1 is consumed by the physical etching process.

Figure 6:
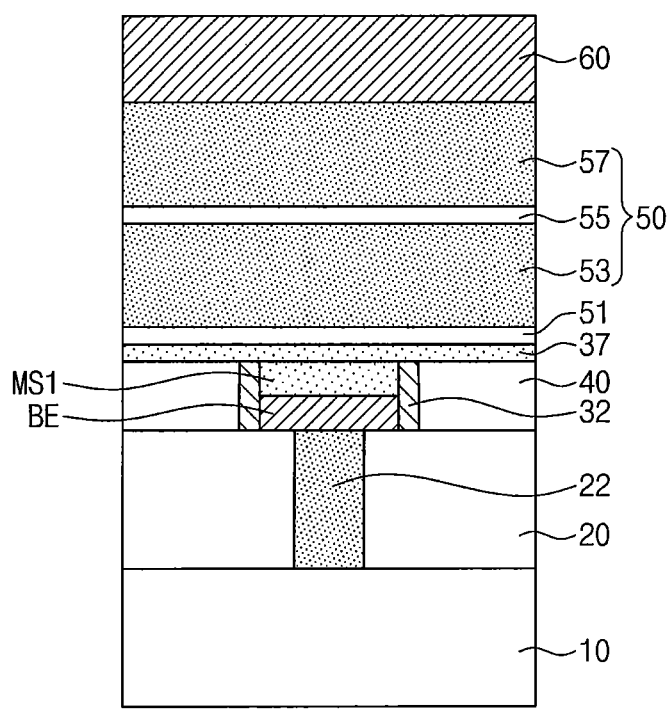

Referring to FIG. 6, a magnetic recovery layer 37 may be formed on the lower magnetic conductive pattern MS1 and the upper interlayer insulating layer 40. The magnetic recovery layer 37 may include the same material as the lower magnetic conductive pattern MS1. For example, the magnetic recovery layer 37 may include cobalt-iron-boron (CoFeB) or iron-boron (FeB). In this case, a boron (B) concentration of the magnetic recovery layer 37 may be lower than that of the lower magnetic conductive pattern MS1. The magnetic recovery layer 37 may cure the damage of the lower magnetic conductive pattern MS1 by a subsequent heat treatment process. In other words, the damage of the lower magnetic conductive pattern MS1 containing the excessive amount of boron (B) may be cured by the magnetic recovery layer 37 of which the boron concentration is controlled. The magnetic recovery layer 37 may have a thickness of about 1 Å to about 30 Å. In particular, the magnetic recovery layer 37 may have a thickness of about 1 Å to about 10 Å. In more particular, the magnetic recovery layer 37 may have a thickness of about 1 Å to about 5 Å. Although not illustrated in FIG. 7, some embodiments provide that the magnetic recovery layer 37 is formed before the capping pattern is formed and thus includes a width that is the same as the lower magnetic conductive pattern MS1 and the bottom electrode BE. In some embodiments, the insulating side wall spacer 32 is formed on side walls of the magnetic recovery layer RL.

A tunnel barrier layer 51 may be formed on the magnetic recovery layer 37. The tunnel barrier layer 51 may include at least one of magnesium oxide, titanium oxide, aluminum oxide, magnesium-zinc oxide, and/or magnesium-boron oxide.

The second magnetic conductive layer 50 may be formed on the tunnel barrier layer 51. The second magnetic conductive layer 50 may include a first ferromagnetic layer 53, an exchange coupling layer 55, and a second ferromagnetic layer 57 which are sequentially stacked. Each of thicknesses of the first and second ferromagnetic layers 53 and 57 may be greater than that of the first magnetic conductive layer 33. A magnetization direction of the first ferromagnetic layer 53 may be opposite or anti-parallel to a magnetization direction of the second ferromagnetic layer 57.

The first and second ferromagnetic layers 53 and 57 may include a ferromagnetic material and may have magnetization directions parallel to the top surface of the substrate 10. In this case, each of the first and second ferromagnetic layers 53 and 57 may include at least one of cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). In some embodiments, magnetization directions of the first and second ferromagnetic layers 53 and 57 may be substantially perpendicular to the top surface of the substrate 10. In this case, each of the first and second ferromagnetic layers 53 and 57 may include a perpendicular magnetic material (e.g., CoFeTb, CoFeGd, CoFeDy, and/or CoTb), a perpendicular magnetic material having a $L1_0$ structure, cobalt-platinum (Copt) having a hexagonal close packed (HCP) lattice structure, or a multi-layered structure (e.g., Co/Pt or Co/Pd). Here, the perpendicular magnetic material having the $L1_0$ structure may include at least one of iron-platinum (FePt) of the $L1_0$ structure, iron-palladium (FePd) of the $L1_0$ structure, cobalt-palladium (CoPd) of the $L1_0$ structure, and/or cobalt-platinum (CoPt) of the $L1_0$ structure.

The exchange coupling layer 55 may include at least one of non-magnetic metal elements including non-magnetic transition metals. For example, the exchange coupling layer 55 may include at least one of magnesium (Mg), aluminum (Al), titanium (Ti), chrome (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and/or hafnium (Hf).

A top electrode layer 60 may be formed on the second magnetic conductive layer 50. The top electrode layer 60 may include at least one of a conductive metal nitride (e.g., titanium nitride and/or tantalum nitride), a transition metal (e.g., titanium and/or tantalum), and/or a rare-earth metal (e.g., ruthenium and/or platinum).

The processes with reference to FIGS. 5 and 6 may be continuously performed in the vacuum in a state that the substrate 10 is not exposed in the atmosphere. Thus, even though the capping pattern 36 is removed, the lower magnetic conductive pattern MS1 may be protected from the external atmosphere.

Figure 7:
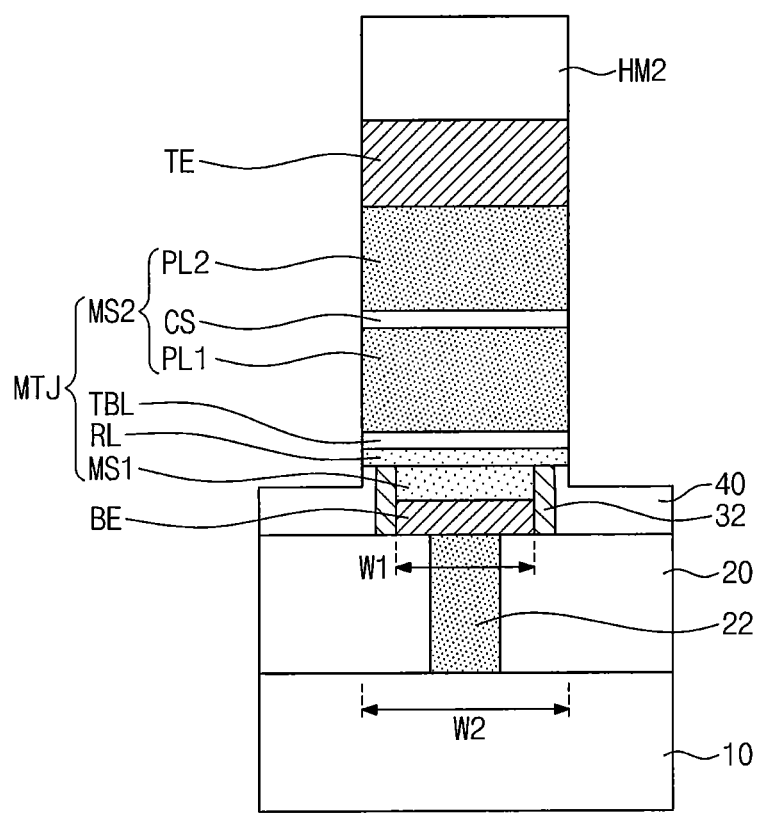

Referring to FIG. 7, the top electrode layer 60, the second magnetic conductive layer 50, the tunnel barrier layer 51, and the magnetic recovery layer 37 may be patterned using a second mask pattern HM2. The second mask pattern HM2 may include silicon nitride. As a result, a top electrode TE and an upper magnetic conductive pattern MS2 may be formed. Additionally, a tunnel barrier pattern TBL and a magnetic recovery pattern RL may be formed between the upper magnetic conducive pattern MS2 and the lower magnetic conductive pattern MS1. The upper magnetic conductive pattern MS2 may be a pinned pattern having a fixed magnetization direction. The upper magnetic conductive pattern MS2 may include a first pinned pattern PL1, a second pinned pattern PL2, and an exchange coupling pattern CS disposed between the first and second pinned patterns PL1 and PL2. A magnetic tunnel junction MTJ may include the lower magnetic conductive pattern MS1, the tunnel barrier pattern TBL, and the upper magnetic conductive pattern MS2. The magnetic recovery pattern RL may be disposed between the lower magnetic conductive pattern MS1 and the tunnel barrier pattern TBL.

The top electrode TE, the upper magnetic conductive pattern MS2, the tunnel barrier pattern TBL, and the magnetic recover pattern RL may constitute an upper structure. A width W2 of a bottom surface of the upper structure may be greater than a width W1 of a top surface of the lower magnetic conductive pattern MS1, so a portion of the magnetic recovery pattern RL may be in direct contact with the upper interlayer insulating layer 40.

Figure 8:
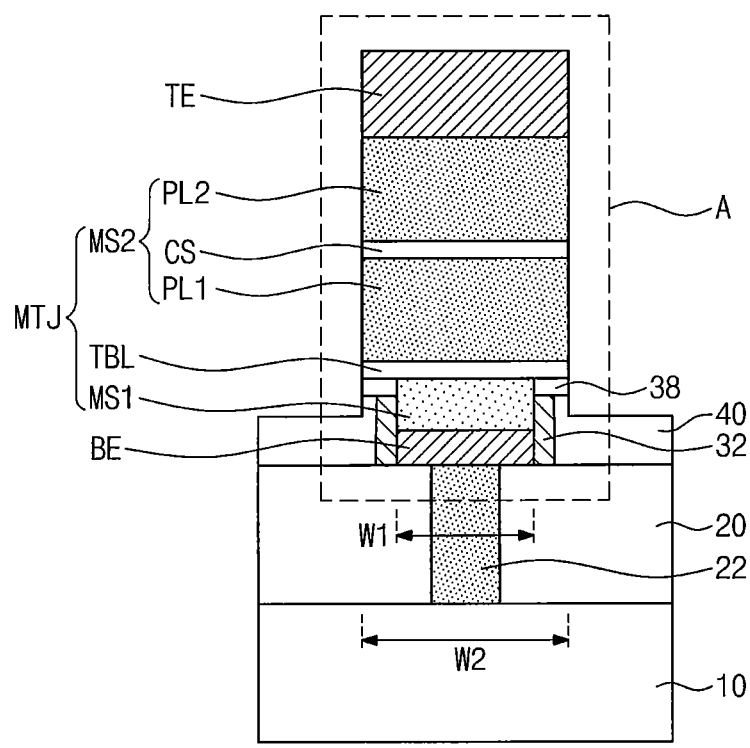

Referring to FIG. 8, subsequent processes including a heat treatment process may be performed, so the portion of the magnetic recovery pattern RL, which is in contact with the upper interlayer insulating layer 40, may be changed into a metal oxide layer 38. The metal oxide layer 38 may be an oxide of the magnetic recovery pattern RL. A portion of the tunnel barrier pattern TBL may vertically overlap with the upper interlayer insulating layer 40. In other words, the tunnel barrier pattern TBL may have a width greater than that of the lower magnetic conductive pattern MS1 and may extend onto the upper interlayer insulating layer 40. The metal oxide layer 38 may be formed between the tunnel barrier pattern TBL and the upper interlayer insulating layer 40.

The magnetic recovery pattern RL and the lower magnetic conductive pattern MS1 thereunder may constitute one united body by the heat treatment process. In other words, the magnetic recovery pattern RL may be converted into a portion of the lower magnetic conductive pattern MS1 by the heat treatment process.

According to the inventive concepts, due to the existence of the capping pattern 36 of FIG. 4, a tunneling magnetoresistance (TMR) ratio of the magnetic tunnel junction MTJ was in a range of 120% to 140% and a sheet resistance (RA) of the magnetic tunnel junction MTJ was in a range of 20 $\Omega/cm^2$ to 40 $\Omega/cm^2$. According to some embodiments of the inventive concepts, an interface between the tunnel barrier pattern TBL and the lower magnetic conductive pattern MS1 may have a roughness of 5 Å RMS or less.

On the other hand, if the capping pattern 36 of FIG. 4 does not exist, the top surface of the lower magnetic conductive pattern MS1 may be damaged. In this case, even though a curing process such as the heat treatment process was performed, a tunneling magnetoresistance (TMR) ratio of the magnetic tunnel junction MTJ was 100% or less and a sheet resistance (RA) of the magnetic tunnel junction MTJ was in a range of 50 $\Omega/cm^2$ to 60 $\Omega/cm^2$. Thus, even though the rough oxide layer generated on the top surface of the lower magnetic conductive pattern MS1 is removed, an interface characteristic between the lower magnetic conductive pattern MS1 and the tunnel barrier pattern TBL may be deteriorated. In other words, if the top surface of the lower magnetic conductive pattern MS1 is damaged, characteristics of the magnetic tunnel junction MTJ may not be recovered.

According to some embodiments of the inventive concepts, it is possible to prevent the characteristics of the magnetic tunnel junction MTJ from being deteriorated by the damage of the top surface of the lower magnetic conductive pattern MS1.

Figure 9:
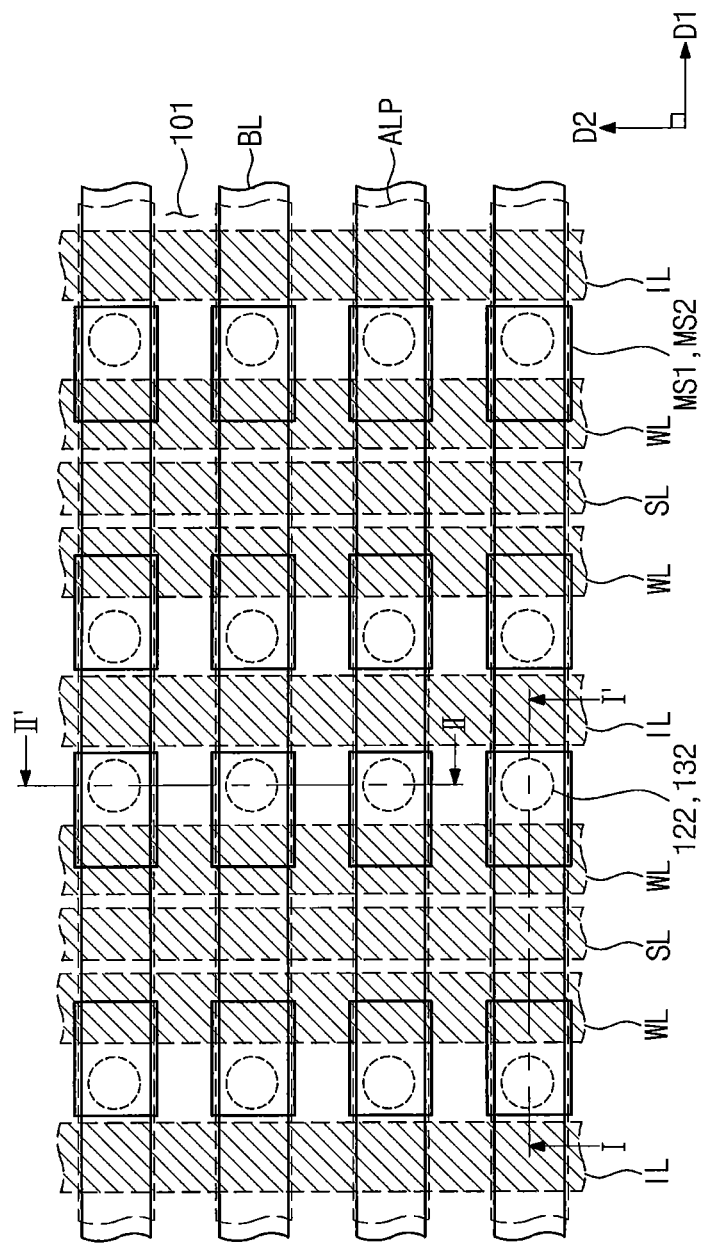
FIG. 9 is a plan view illustrating a magnetic memory device according to some embodiments of the inventive concepts.
Figure 10:
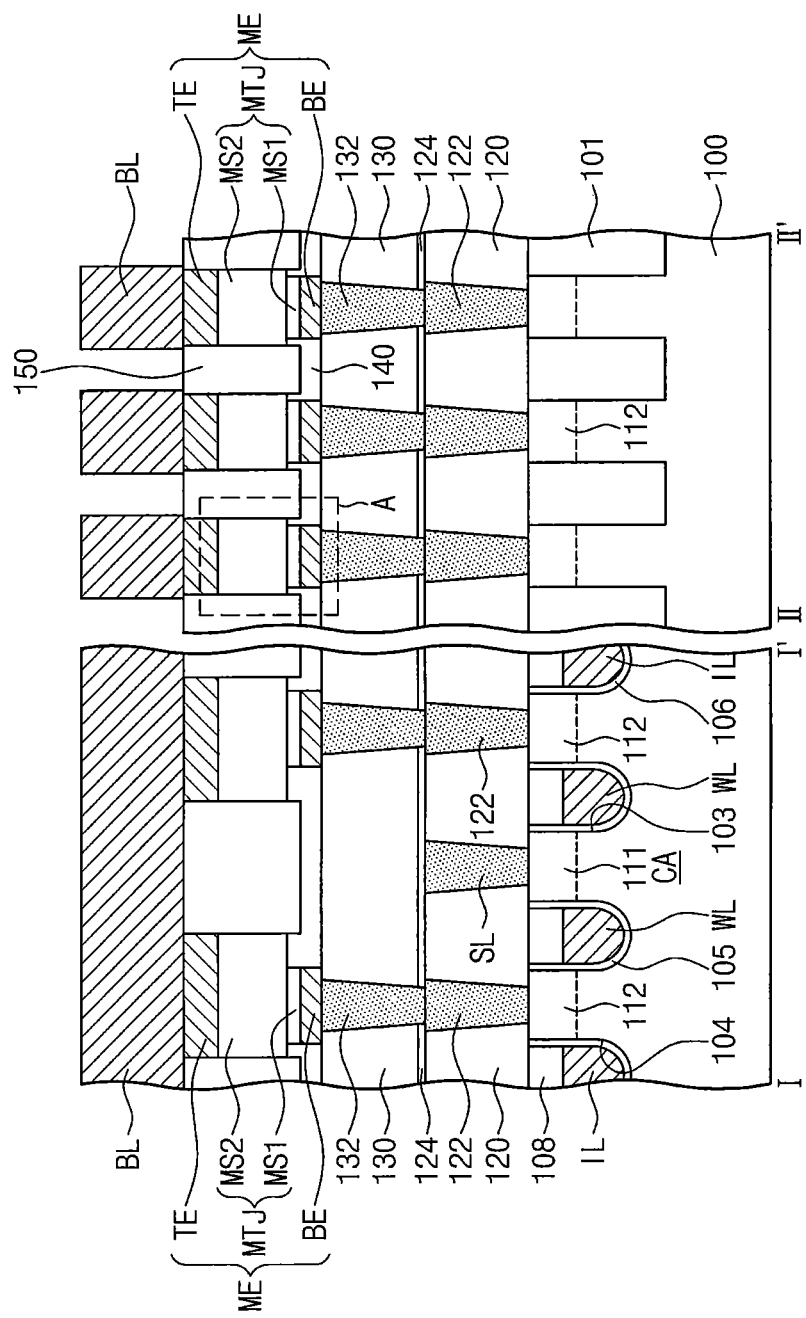
FIG. 10 is a cross-sectional view taken along lines I-I' and II-II' of FIG. 9.

FIG. 9 is a plan view illustrating a magnetic memory device according to some embodiments of the inventive concepts, and FIG. 10 is a cross-sectional view taken along lines I-I' and II-II' of FIG. 9.

Referring to FIGS. 9 and 10, a substrate 100 (e.g., a semiconductor substrate) is provided. The substrate 100 may be a silicon substrate, a germanium substrate, or a silicon-germanium substrate. The substrate 100 may have a first conductivity type. Device isolation patterns 101 may be formed in the substrate 100. The device isolation patterns 101 may define active line patterns ALP. As illustrated in FIG. 9, the active line patterns ALP may extend in parallel along a first direction D1 and may have linear shapes when viewed from a plan view. The device isolation patterns 101 and the active line patterns ALP may be alternately arranged in a second direction D2 perpendicular to the first direction D1. The active line patterns ALP may be doped with dopants of the first conductivity type.

Isolation recess regions 104 may intersect the active line patterns ALP and the device isolation patterns 101. When viewed from a plan view, the isolation recess regions 104 may have groove shapes that extend in parallel along the second direction D2. The isolation recess regions 104 may divide the active line patterns ALP into active patterns CA. Each of the active patterns CA may be a portion of the active line pattern ALP that is disposed between a pair of isolation recess regions 104 that are adjacent one another. In other words, each of the active patterns CA may be defined by a pair of device isolation patterns 101 that are adjacent one another and the pair of isolation recess regions 104 that are adjacent one another. The active patterns CA may be arranged in a matrix form along the first and second directions D1 and D2 when viewed from a plan view.

At least one gate recess region 103 may intersect the active patterns CA arranged along the second direction D2. The gate recess region 103 may have a groove shape extending in parallel to the isolation recess regions 104. In some embodiments, a pair of gate recess regions 103 may intersect each active pattern CA. In this case, a pair of cell transistors may be formed at each active pattern CA.

Depths of the gate recess regions 103 may be substantially equal to those of the isolation recess regions 104. Widths of the gate recess regions 103 may be equal to or different from those of the isolation recess regions 104. The depth of each of the gate and isolation recess regions 103 and 104 may be smaller than depths of the device isolation patterns 101.

A word line WL may be disposed in each gate recess region 103. A cell gate dielectric layer 105 may be disposed between the word line WL and an inner surface of each gate recess region 103. Due to the shape of the gate recess region 103, the word line WL may have a line shape extending in the second direction D2. The cell transistor may include the word line WL and a channel region recessed by the gate recess region 103.

An isolation line IL may be disposed in each isolation recess region 104. An isolation gate dielectric layer 106 may be disposed between the isolation line IL and an inner surface of each isolation recess region 104. The isolation line IL may have a line shape extending in the second direction D2.

A gate mask pattern 108 may be disposed on each of the word line WL and the isolation line IL. A top surface of the word line WL and a top surface of the isolation line IL may be lower than a top of the gate recess region 103 and a top of the isolation recess region 104, respectively. The gate mask patterns 108 may be disposed in the gate and isolation recess regions 103 and 104. Top surfaces of the gate mask patterns 108 may be substantially coplanar with the top surface of the substrate 100.

An isolation voltage may be applied to the isolation lines IL when the magnetic memory device is operated. The isolation voltage may prevent channels from being formed under the isolation recess regions 104. In other words, an isolation channel region under the isolation line IL may be turned-off by the isolation voltage. Thus, the active patterns CA divided from each active line pattern ALP may be electrically isolated from each other. For example, if the active line patterns ALP are doped with P-type dopants, the isolation voltage may be a ground voltage or a negative voltage.

For example, the word line WL may include at least one of a semiconductor material doped with dopants (e.g., doped silicon), metal (e.g., tungsten, aluminum, titanium, and/or tantalum), conductive metal nitride (e.g., titanium nitride, tantalum nitride, and/or tungsten nitride), and/or metal-semiconductor compound (e.g., a metal silicide). In some embodiments, the isolation line IL may be formed of the same material as the word line WL. For example, the cell gate dielectric layer 105 and the isolation gate dielectric layer 106 may include at least one of silicon oxide, silicon nitride, silicon oxynitride, and/or high-k dielectric (e.g., an insulating metal oxide such as hafnium oxide and/or aluminum oxide). The gate mask pattern 108 may include at least one of, for example, silicon oxide, silicon nitride, and/or silicon oxynitride.

A first doped region 111 may be disposed in each active pattern CA between the word lines WL that are adjacent one another. A second doped region 112 may be disposed in each active pattern CA between the word line WL and the isolation line IL that are adjacent one another. In some embodiments, the first doped region 111 may be disposed in a central portion of each active pattern CA, and a pair of second doped regions 112 may be respectively disposed in both edge portions of each active pattern CA. Thus, the pair of cell transistors formed at each active pattern CA may share the first doped region 111. The first and second doped regions 111 and 112 may correspond to source/drain regions of the cell transistor. The first and second doped regions 111 and 112 may be doped with dopants of a second conductivity type different from the first conductivity type. One of the first and second conductivity types may be an N-type, and the other of the first and second conductivity types may be a P-type.

A first interlayer insulating layer 120 may be disposed on the substrate 100. The first interlayer insulating layer 120 may be formed of, for example, silicon oxide. Source lines SL may fill source grooves formed in the first interlayer insulating layer 120, respectively. The source lines SL may extend in parallel in the second direction D2. Each source lines SL may include at least one of a semiconductor material doped with dopants (e.g., doped silicon), metal (e.g., tungsten, aluminum, titanium, and/or tantalum), conductive metal nitride (e.g., titanium nitride, tantalum nitride, and/or tungsten nitride), and/or metal-semiconductor compound (e.g., a metal silicide). Each source line SL may be electrically connected in common to the first doped regions 111 arranged in the second direction D2. First contact plugs 122 may be disposed in first contact holes formed in the first interlayer insulating layer 120 so as to be connected to the second doped regions 112, respectively. The first contact plugs 122 may be formed of the same material as the source lines SL. Top surfaces of the source lines SL and top surfaces of the first contact plugs 122 may be substantially coplanar with a top surface of the first interlayer insulating layer 120.

A capping insulating layer 124 may be disposed on the first interlayer insulating layer 120. The capping insulating layer 124 may cover the top surfaces of the source lines SL. The capping insulating layer 124 may be formed of an insulating material having an etch selectivity with respect to the first interlayer insulating layer 120. In some embodiments, the first interlayer insulating layer 120 may be formed of, for example, silicon oxide, and the capping insulating layer 124 may be formed of, for example, silicon nitride and/or silicon oxynitride.

A second interlayer insulating layer 130 may be disposed on the capping insulating layer 124. The second interlayer insulating layer 130 may be formed of, for example, silicon oxide.

Second contact plugs 132 may sequentially penetrate the second interlayer insulating layer 130 and the capping insulating layer 124. The second contact plugs 132 may be electrically connected to the second doped regions 112 through the first contact plugs 122, respectively. In some embodiments, ohmic patterns (not shown) may be disposed between the second contact plugs 132 and the first contact plugs 122, between the first contact plugs 122 and the second doped regions 112, and between the source lines SL and the first doped regions 111. The ohmic patterns may include a metal-semiconductor compound (e.g., a metal silicide such as cobalt silicide or titanium silicide).

A plurality of memory elements ME may be disposed on the second interlayer insulating layer 130. Each of the memory elements ME may include a bottom electrode BE, a magnetic tunnel junction MTJ, and a top electrode TE. In more detail, the magnetic tunnel junction MTJ may have the structure illustrated in FIG. 8. A portion 'A' of FIG. 10 corresponds to a portion 'A' of FIG. 8. The magnetic tunnel junction MTJ may include the lower magnetic conductive pattern MS1 and the upper magnetic conductive pattern MS2. As illustrated in FIG. 8, the tunnel barrier pattern TBL is disposed between the lower magnetic conductive pattern MS1 and the upper magnetic conductive pattern MS2. The magnetic recovery pattern RL may be disposed between the lower magnetic conductive pattern MS1 and the tunnel barrier pattern TBL. Alternatively, the magnetic recovery pattern RL and the lower magnetic conductive pattern MS1 may constitute one united body as described with reference to FIG. 8.

In some embodiments, each of the lower and upper magnetic conductive patterns MS1 and MS2 may have an island shape formed by a patterning process. The lower and upper magnetic conductive patterns MS1 and MS2 having the island shapes may vertically overlap with the each of the second contact plugs 132.

A third interlayer insulating layer 140 may be formed on the second interlayer insulating layer 130 and may be in contact with sidewalls of the bottom electrode BE and the lower magnetic conductive pattern MS1. A fourth interlayer insulating layer 150 may be formed on the third interlayer insulating layer 140 and may be in contact with sidewalls of the upper magnetic conductive pattern MS2 and the top electrode TE. The fourth interlayer insulating layer 150 may expose a top surface of the top electrode TE.

A bit line BL may be disposed on the fourth interlayer insulating layer 150. The bit line BL may extend in the first direction D1. The bit line BL may be connected in common to a plurality of the memory elements ME arranged in the first direction D1. A contact plug may not exist between the bit line BL and each memory element ME. Thus, manufacturing processes of the magnetic memory device may be simplified and a contact resistance between the bit line BL and each memory element ME may be reduced. In addition, dispersion of contact resistances between the bit line BL and the memory elements ME may be reduced.

FIGS. 11 to 13, 14A, and 15A are cross-sectional views corresponding to lines I-I' and II-II' of FIG. 9 to illustrate a method of forming a magnetic memory device according to some embodiments of the inventive concepts.

Figure 11:
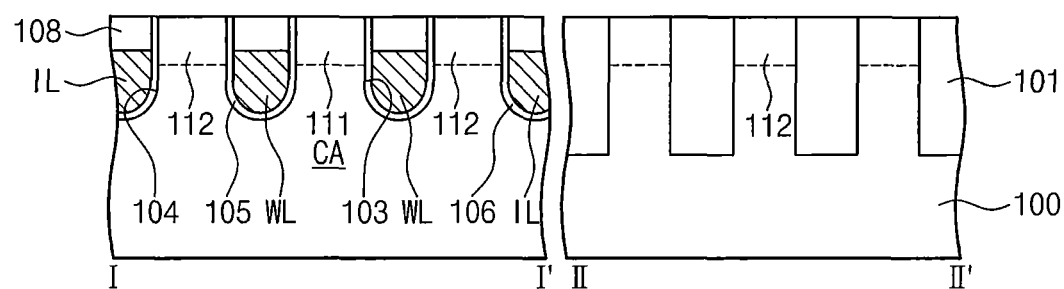
FIGS. 11 to 13, 14A, and 15A are cross-sectional views corresponding to lines I-I' and II-II' of FIG. 9 to illustrate methods of forming a magnetic memory device according to some embodiments of the inventive concepts.

Referring to FIGS. 9 and 11, a substrate 100 is provided. The substrate 100 may be a silicon substrate, a germanium substrate, and/or a silicon-germanium substrate. The substrate 100 may have a first conductivity type.

Device isolation patterns 101 may be formed in the substrate 100 to define active line patterns ALP. The active line patterns ALP may extend in parallel along the first direction D1 of FIG. 9. The device isolation patterns 101 may be formed using a shallow trench isolation (STI) technique.

The active line patterns ALP and the device isolation patterns 101 may be patterned to form gate recess regions 103 and isolation recess regions 104 that extend in parallel to each other in the second direction D2 of FIG. 9. The isolation recess regions 104 may divide each active line pattern ALP into a plurality of active patterns CA. The gate recess regions 103 may intersect the active patterns CA. A depth of each of the gate and isolation recess regions 103 and 104 may be smaller than depths of the device isolation patterns 101.

A cell gate dielectric layer 105 may be formed on an inner surface of each gate recess region 103 to have a substantially uniform thickness. An isolation gate dielectric layer 106 may be formed on an inner surface of each isolation recess region 104 to have a substantially uniform thickness. In some embodiments, the cell and isolation gate dielectric layers 105 and 106 may be formed at the same time. The cell and isolation gate dielectric layers 105 and 106 may be silicon oxide layers that are formed by thermally oxidizing the substrate 100. Alternatively, the cell and isolation gate dielectric layers 105 and 106 may include at least one of silicon oxide, silicon nitride, silicon oxynitride, and/or high-k dielectric (e.g., an insulating metal oxide such as hafnium oxide or aluminum oxide).

Subsequently, a first conductive layer may be formed to fill the recess regions 103 and 104. The first conductive layer may include at least one of a semiconductor material doped with dopants (e.g., doped silicon), metal (e.g., tungsten, aluminum, titanium, and/or tantalum), conductive metal nitride (e.g., titanium nitride, tantalum nitride, and/or tungsten nitride), and/or metal-semiconductor compound (e.g., a metal silicide). The first conductive layer may be etched to form a word line in each gate recess region 103 and an isolation line IL in each isolation region 104. Top surfaces of the word line WL and the isolation line IL may be recessed to be lower than a top surface of the substrate 100.

Gate mask patterns 108 may be formed to fill the recess regions 103 and 104 on the word and isolation lines WL and IL. The gate mask patterns 108 may include at least one of silicon oxide, silicon nitride, or silicon oxynitride.

Dopants of a second conductive type different from the first conductivity type may be injected into the active patterns CA at both sides of the word lines WL to form first doped regions 111 and second doped regions 112. Bottom surfaces of the first and second doped regions 111 and 112 may be higher than bottom ends of the word and isolation lines WL and IL.

Figure 12:
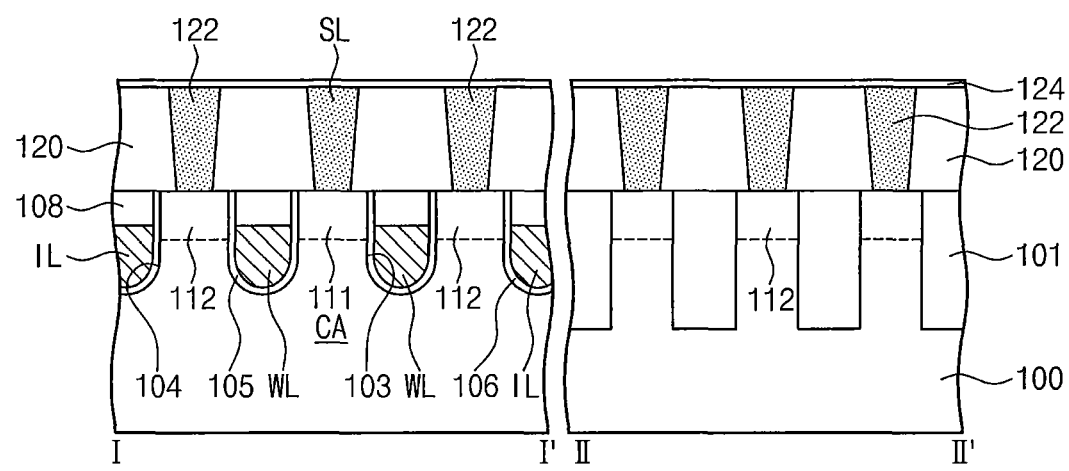

Referring to FIGS. 9 and 12, a first interlayer insulating layer 120 may be formed on the substrate 100. For example, the first interlayer insulating layer 120 may be formed of silicon oxide. The first interlayer insulating layer 120 may be patterned to form cell holes and source grooves.

A second conductive layer may be formed to fill the cell holes and the source grooves. The second conductive layer may include at least one of a semiconductor material doped with dopants (e.g., doped silicon), a metal (e.g., tungsten, aluminum, titanium, and/or tantalum), conductive metal nitride (e.g., titanium nitride, tantalum nitride, and/or tungsten nitride), or metal-semiconductor compound (e.g., a metal silicide). The second conductive layer may be planarized until the first interlayer insulating layer 120 is exposed, so first contact plugs 122 may be formed in the cell holes and source lines SL may be formed in the source grooves. The first contact plugs 122 may be connected to the second doped regions 112. The source lines SL may be connected to the first doped regions 111. In some embodiments, ohmic patterns (not shown) may be formed between the source lines SL and the first doped regions 111 and between the first contact plugs 122 and the second doped regions 112. The ohmic patterns may include a metal-semiconductor compound (e.g., a metal silicide such as cobalt silicide and/or titanium silicide).

Next, a capping insulating layer 124 may be formed on the first interlayer insulating layer 120, the first contact plugs 122, and the source lines SL. The capping insulating layer 124 may be formed of at least one of silicon nitride and/or silicon oxynitride.

Figure 13:
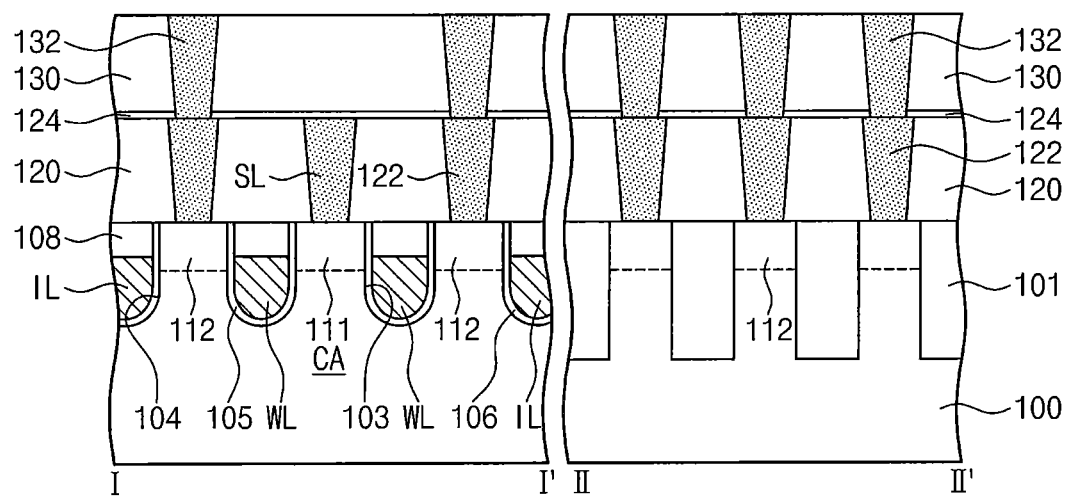

Referring to FIGS. 9 and 13, a second interlayer insulating layer 130 may be formed on the capping insulating layer 124. The second interlayer insulating layer 130 may be formed of silicon oxide. Second contact plugs 132 may be formed to sequentially penetrate the second interlayer insulating layer 130 and the capping insulating layer 124. The second contact plugs 132 may be formed by a method similar to the method of forming the first contact plugs 122. The second contact plugs 132 may be formed of the same material as the first contact plugs 122. The second contact plugs 132 may be connected to the first contact plugs 122 so as to be electrically connected to the second doped regions 112, respectively. In some embodiments, ohmic patterns (not shown) may be formed between the second contact plugs 132 and the first contact plugs 122. The ohmic patterns may include a metal-semiconductor compound (e.g., a metal silicide such as cobalt silicide and/or titanium silicide).

Figure 14A:
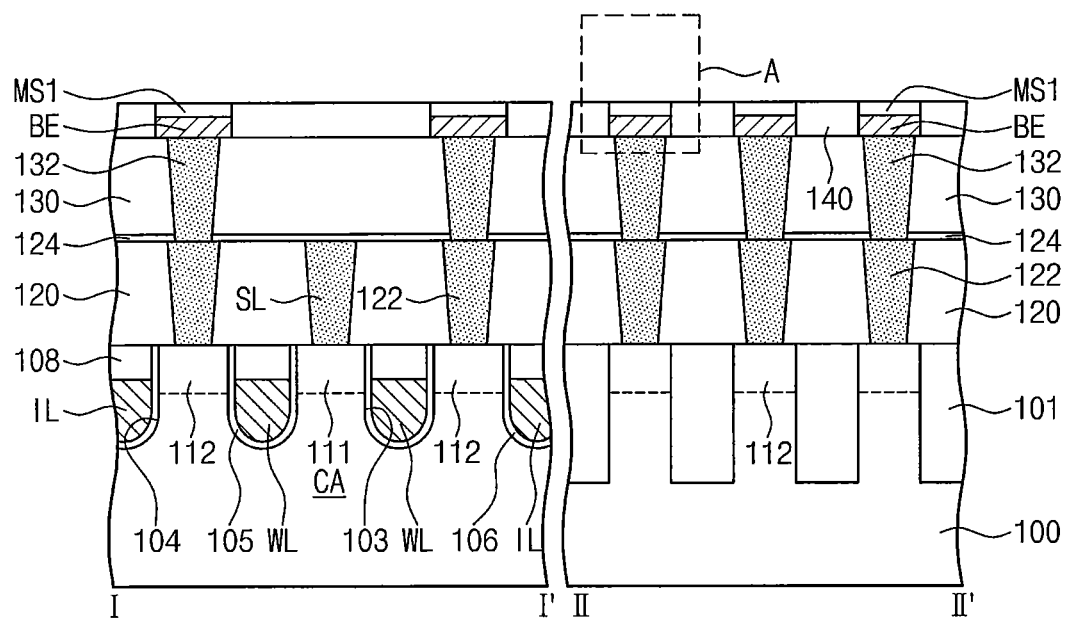

Referring to FIGS. 9 and 14A, a bottom electrode BE and a lower magnetic conductive pattern MS1 may be formed on the second interlayer insulating layer 130. The bottom electrode BE may include at least one of conductive metal nitride (e.g., titanium nitride and/or tantalum nitride), transition metal (e.g., titanium and/or tantalum), or rare-earth metal (e.g., ruthenium and/or platinum). The lower magnetic conductive pattern MS1 may have a magnetization direction parallel to the top surface of the substrate 100. In this case, the lower magnetic conductive pattern MS1 may include at least one of iron and cobalt. For example, the lower magnetic conductive pattern MS1 may include at least one of cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). In some embodiments, the magnetization direction of the lower magnetic conductive pattern MS1 may be substantially perpendicular to the top surface of the substrate 100. In this case, the lower magnetic conductive pattern MS1 may include a perpendicular magnetic material (e.g., CoFeTb, CoFeGd, CoFeDy, and/or CoTb), a perpendicular magnetic material having a $L1_0$ structure, cobalt-platinum (CoPt) having a hexagonal close packed (HCP) lattice structure, or a multi-layered structure (e.g., Co/Pt and/or Co/Pd). Here, the perpendicular magnetic material having the $L1_0$ structure may include at least one of iron-platinum (FePt) of the $L1_0$ structure, iron-palladium (FePd) of the $L1_0$ structure, cobalt-palladium (CoPd) of the $L1_0$ structure, or cobalt-platinum (CoPt) of the $L1_0$ structure.

Figure 14B:
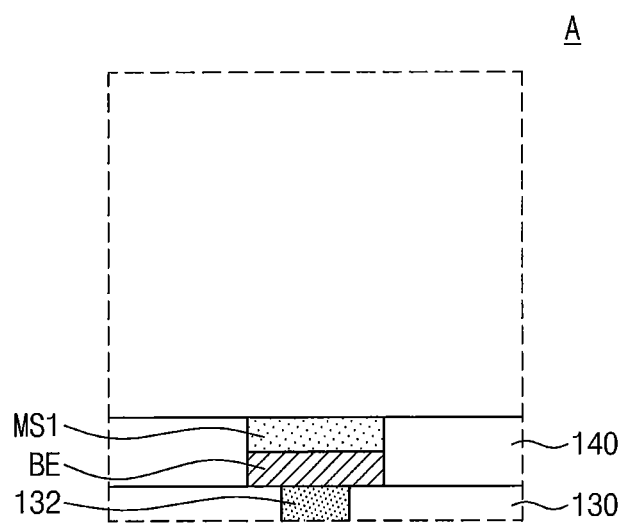
FIGS. 14B and 15B are enlarged views of portions 'A' of FIGS. 14A and 15A, respectively.

Each of the lower magnetic conductive pattern MS1 and the bottom electrode BE may have an island shape formed by a patterning process. The lower magnetic conductive pattern MS1 and the bottom electrode BE having the island shapes may vertically overlap with the each of the second contact plugs 132. The lower magnetic conductive pattern MS1 may have a changeable magnetization direction. A third interlayer insulating layer 140 may be formed on the second interlayer insulating layer 130 to fill a space between a plurality of lower magnetic conductive patterns MS1. The lower magnetic conductive pattern MS1 and the bottom electrode BE may be formed by the method described with reference to FIGS. 2 to 5. FIG. 14B is an enlarged view of a portion 'A' of FIG. 14A. A structure of FIG. 14B may be similar to that of FIG. 5.

Figure 15A:
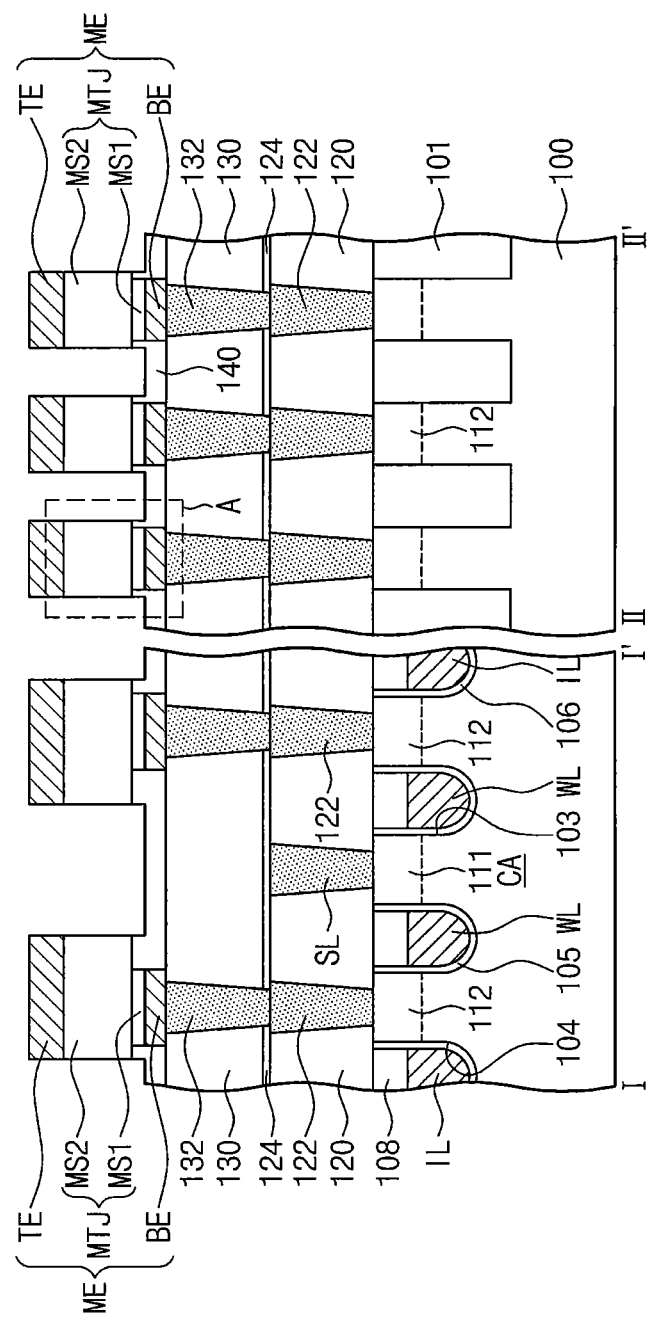
Figure 15B:
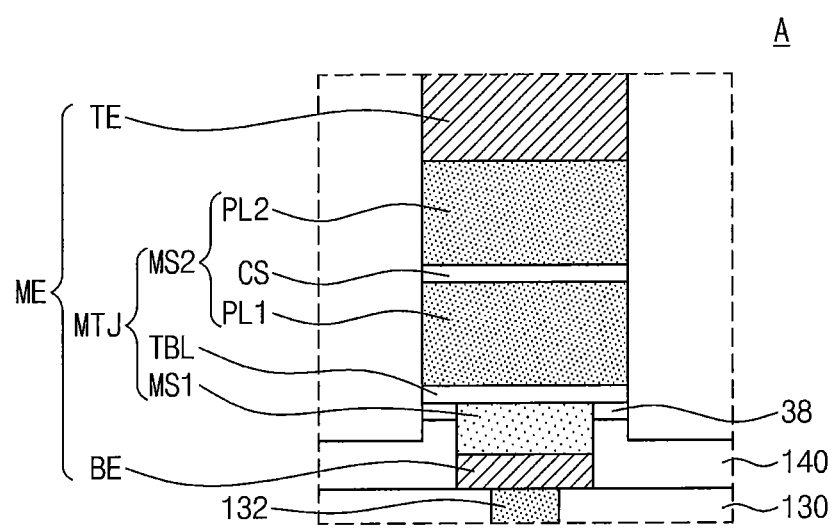

Referring to FIGS. 9 and 15A, an upper magnetic conductive pattern MS2 and a top electrode TE may be formed on the lower magnetic conductive pattern MS1. The upper magnetic conductive pattern MS2 may include a first pinned pattern PL1, a second pinned pattern PL2, and an exchange coupling pattern CS disposed therebetween, as illustrated in FIG. 15B. The upper magnetic conductive pattern MS2 may be a pinned pattern having a fixed magnetization direction. The first pinned pattern PL1 and the second pinned pattern PL2 may have magnetization directions parallel to the top surface of the substrate 100. In this case, each of the first and second pinned patterns PL1 and PL2 may include at least one of, but not limited to, cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). In some embodiments, the magnetization directions of the first and second pinned patterns PL1 and PL2 may be substantially perpendicular to the top surface of the substrate 100. In this case, each of the first and second pinned patterns PL1 and PL2 may include a perpendicular magnetic material (e.g., CoFeTb, CoFeGd, CoFeDy, and/or CoTb), a perpendicular magnetic material having a $L1_0$ structure, cobalt-platinum (CoPt) having a hexagonal close packed (HCP) lattice structure, and/or a multi-layered structure (e.g., Co/Pt or Co/Pd). Here, the perpendicular magnetic material having the $L1_0$ structure may include at least one of iron-platinum (FePt) of the $L1_0$ structure, iron-palladium (FePd) of the $L1_0$ structure, cobalt-palladium (CoPd) of the $L1_0$ structure, and/or cobalt-platinum (CoPt) of the $L1_0$ structure. The exchange coupling pattern CS may include at least one of non-magnetic metal elements including non-magnetic transition metals. For example, the exchange coupling pattern CS may include at least one of magnesium (Mg), aluminum (Al), titanium (Ti), chrome (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and/or hafnium (Hf).

Each of the upper magnetic conductive pattern MS2 and the top electrode TE may have an island shape formed by a patterning process. The upper magnetic conductive pattern MS2 and the top electrode TE having the island shapes may vertically overlap with the lower magnetic conductive pattern MS1. The upper magnetic conductive pattern MS2 and the top electrode TE may be formed by the method described with reference to FIGS. 6 to 8.

A magnetic tunnel junction MTJ may include the lower magnetic conductive pattern MS1 and the upper magnetic conductive pattern MS2. As illustrated in FIG. 15B, the magnetic tunnel junction MTJ may further include a tunnel barrier pattern TBL disposed between the lower magnetic conductive pattern MS1 and the upper magnetic conductive pattern MS2. The tunnel barrier pattern TBL may include at least one of magnesium oxide, titanium oxide, aluminum oxide, magnesium-zinc oxide, or magnesium-boron oxide. In addition, a magnetic recovery pattern RL may be additionally provided between the lower magnetic conductive pattern MS1 and the tunnel barrier pattern TBL. The magnetic recovery pattern RL may include the same material as the lower magnetic conductive pattern MS1. By a heat treatment process, the magnetic recovery pattern RL may become a portion of the lower magnetic conductive pattern MS1.

A width of the tunnel barrier pattern TBL may be greater than a width of the lower magnetic conductive pattern MS1. In addition, a metal oxide layer 38 may be provided between the tunnel barrier pattern TBL and the third interlayer insulating layer 140. For example, the metal oxide layer 38 may be an oxide layer of a material included in the lower magnetic conductive pattern MS1.

Each of memory elements ME may include the bottom electrode BE, the magnetic tunnel junction MTJ, and the top electrode TE. FIG. 15B is an enlarged views of a portion 'A' of FIG. 15A. The structure of FIG. 15B may be similar to that of FIG. 8.

Referring again to FIGS. 9 and 10, the fourth interlayer insulating layer 150 may be formed and the bit line BL may be then formed on the fourth interlayer insulating layer 150. The bit line BL may extend in the first direction D1. The bit line BL may be connected in common to a plurality of memory elements ME arranged in the first direction D1.

Figure 16:
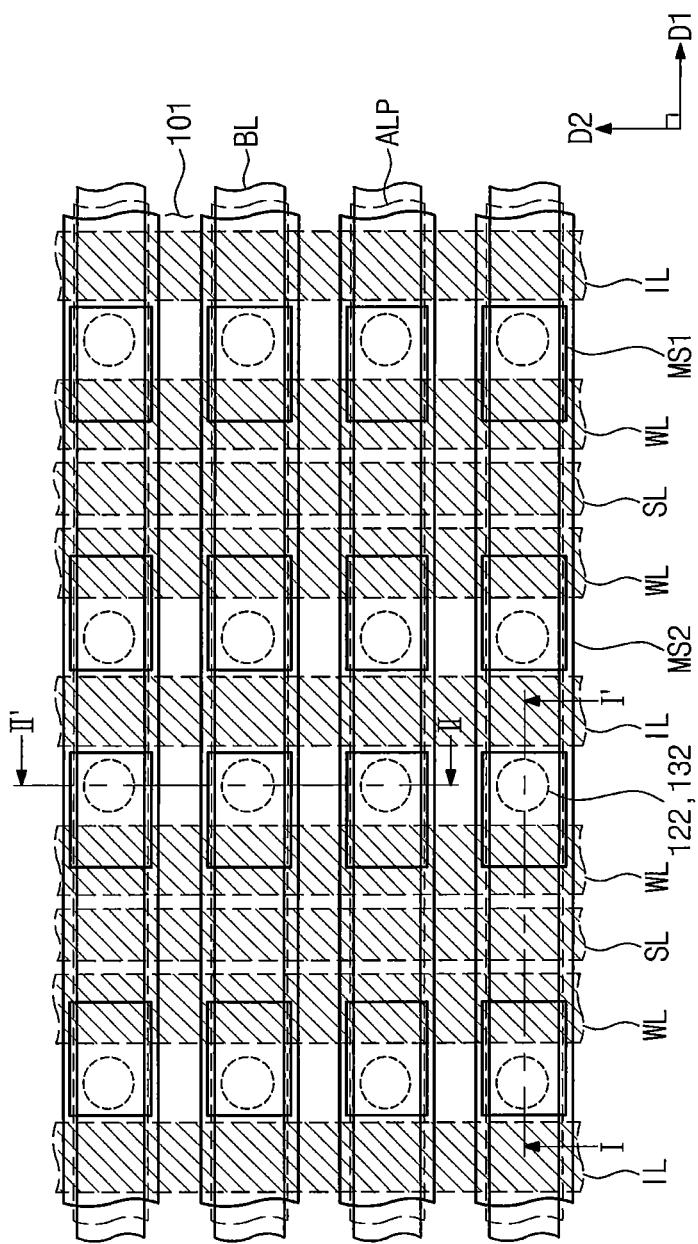
FIG. 16 is a plan view illustrating a magnetic memory device according to some other embodiments of the inventive concepts.
Figure 17:
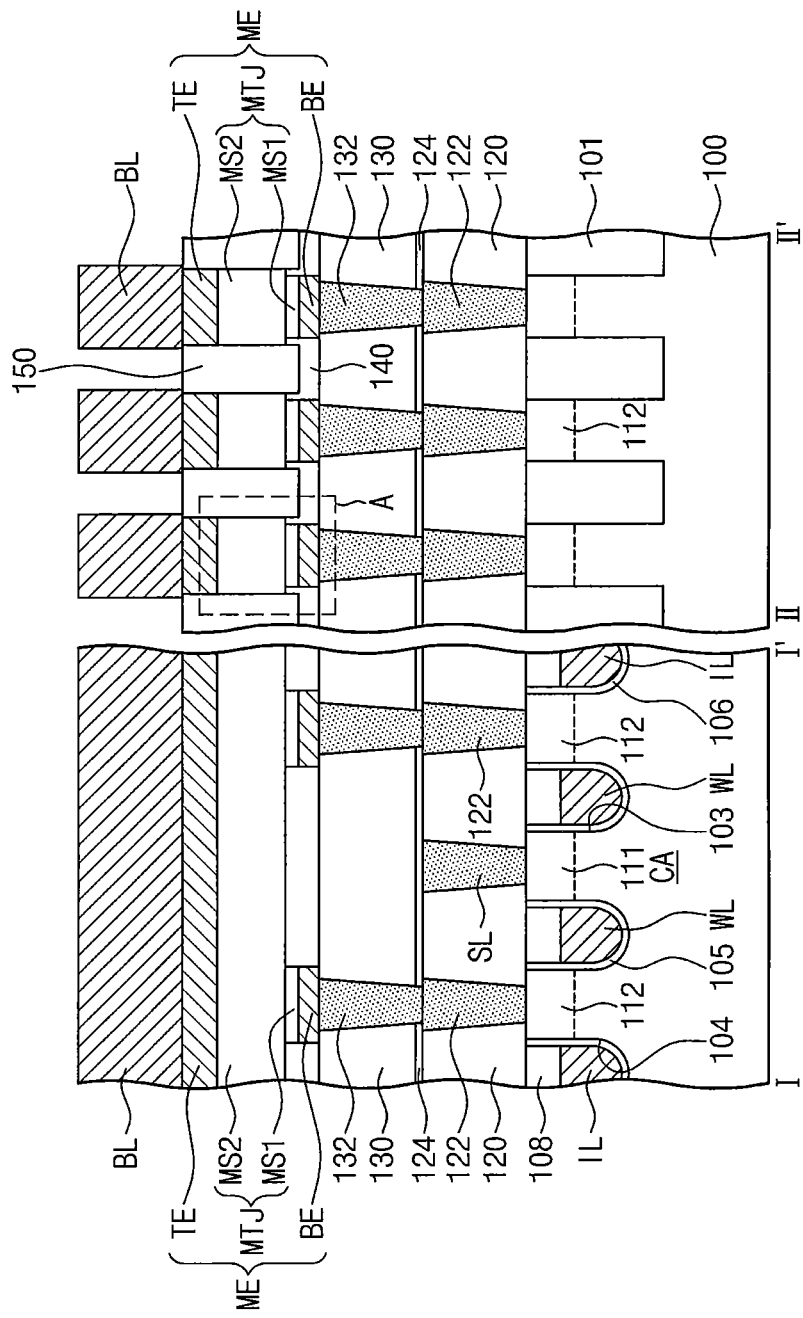
FIG. 17 is a cross-sectional view taken along lines I-I' and II-II' of FIG. 16.

FIG. 16 is a plan view illustrating a magnetic memory device according to some other embodiments of the inventive concepts, and FIG. 17 is a cross-sectional view taken along lines I-I' and II-II' of FIG. 16. In the present embodiment, the same technical features as described in the embodiment of FIGS. 9 and 10 will be omitted or mentioned briefly for the purpose of ease and convenience in explanation. A portion 'A' of FIG. 17 corresponds to a portion 'A' of FIG. 8.

Referring to FIGS. 16 and 17, each of an upper magnetic conductive pattern MS2 and a top electrode TE may have a line shape formed by a patterning process. A tunnel barrier pattern TBL and a magnetic recovery pattern RL may be formed at the same time by the patterning process as shown in FIG. 7. The line-shaped upper magnetic conductive pattern MS2 and the line-shaped top electrode TE may extend along the bit line BL in the first direction D1.

As described above, since the upper magnetic conductive pattern MS2 having a thick thickness is not divided into a plurality of island-shaped patterns by an etching process, it is possible to reduce an etching burden of the upper magnetic conductive patterns MS2. In other words, the lower magnetic conductive pattern MS1 and the bottom electrode BE which have thin thicknesses may be delicately etched to have island shapes but the upper magnetic conductive pattern MS2 and the top electrode TE may not be delicately etched.

Figure 18:
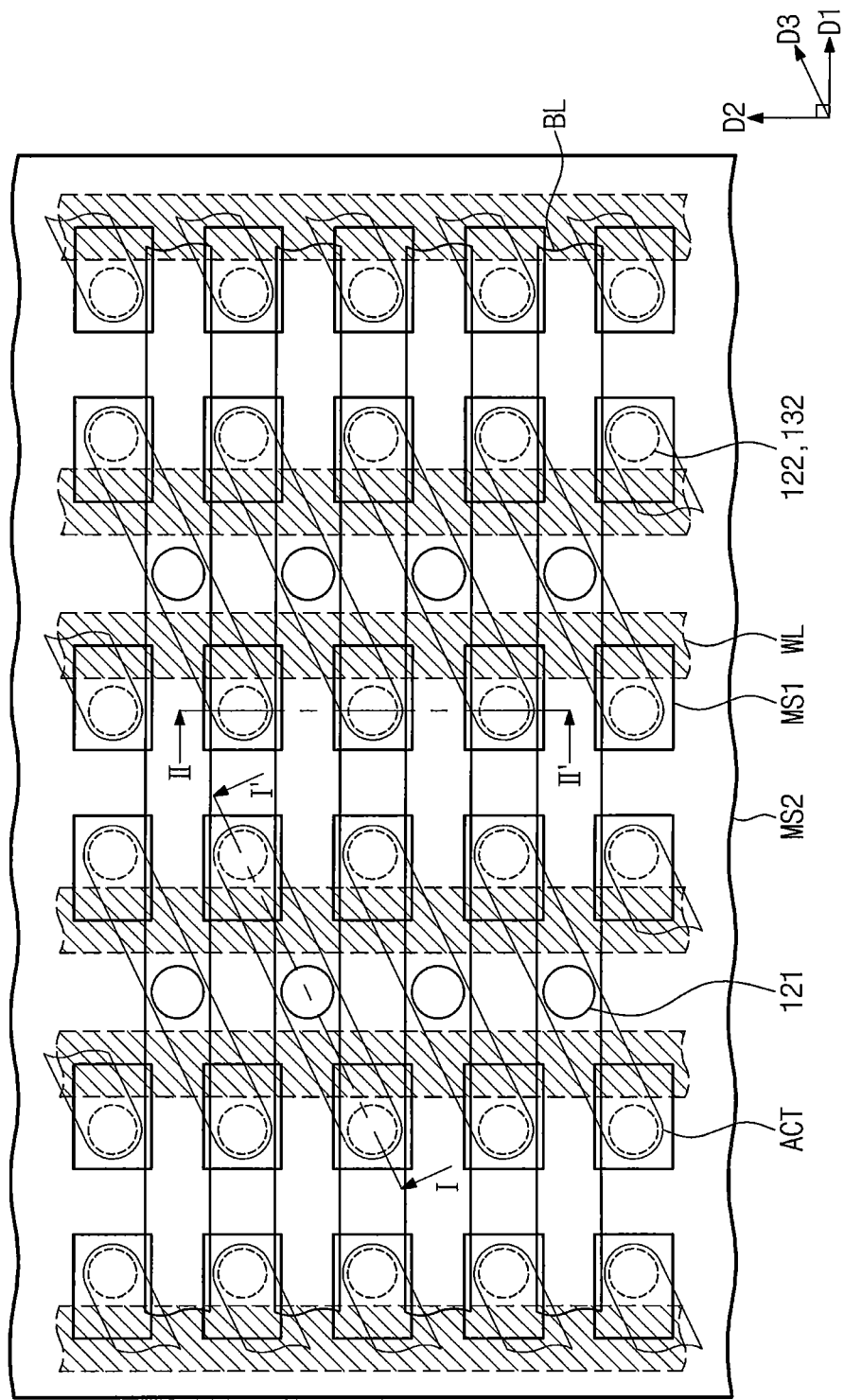
FIG. 18 is a plan view illustrating a magnetic memory device according to some other embodiments of the inventive concepts.
Figure 19:
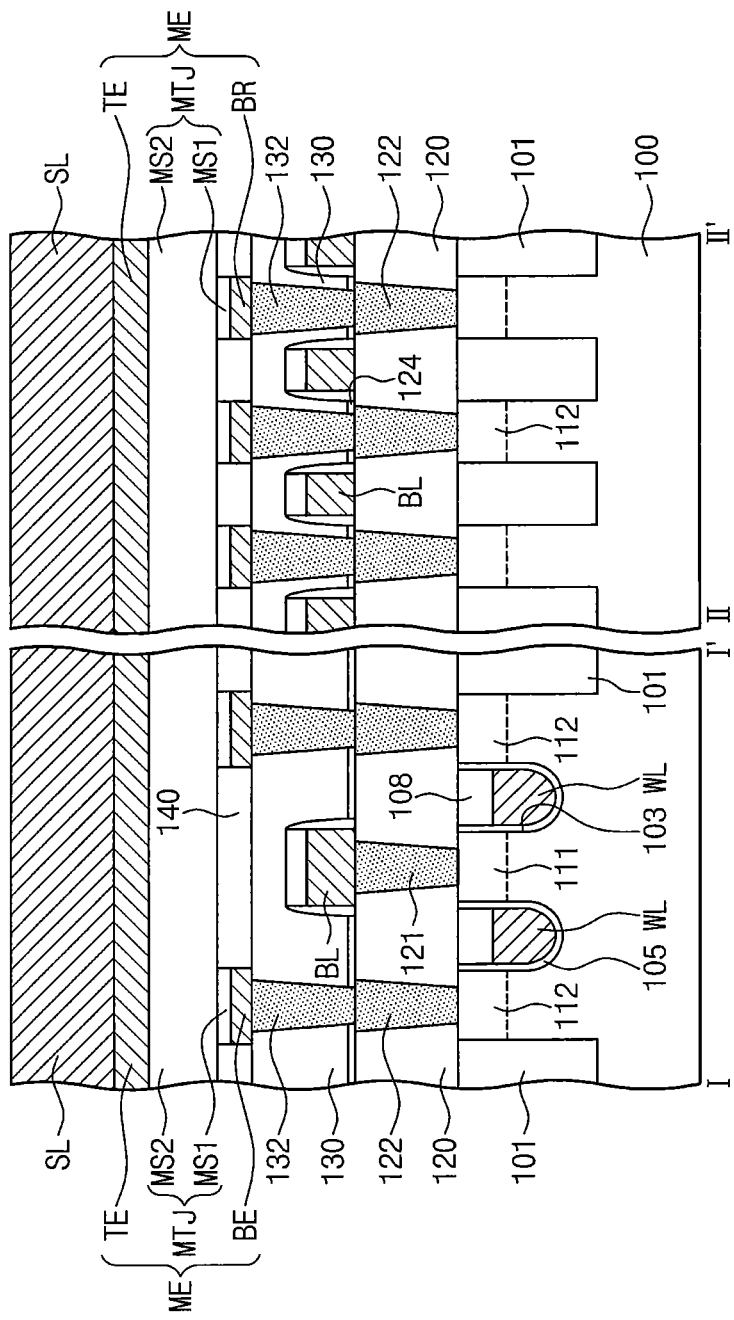
FIG. 19 is a cross-sectional view taken along lines I-I' and II-II' of FIG. 18.

FIG. 18 is a plan view illustrating a magnetic memory device according to some other embodiments of the inventive concepts, and FIG. 19 is a cross-sectional view taken along lines I-I' and II-II' of FIG. 18. In the present embodiments, the same technical features as described in the aforementioned embodiments will be omitted or mentioned briefly for the purpose of ease and convenience in explanation.

Referring to FIGS. 18 and 19, a device isolation layer 101 may be formed in a substrate 100 to define active patterns ACT. The substrate 100 may be a silicon substrate, a germanium substrate, or a silicon-germanium substrate.

The active patterns ACT may be two-dimensionally arranged along a plurality of rows and a plurality of columns. Each of the active patterns ACT may have a rectangular shape (or a bar shape) that extends in a direction D3 diagonal to first and second directions D1 and D2 perpendicular to each other. The active patterns ACT may be arranged along the first direction D1 to constitute each row and may be arranged along the second direction D2 to constitute each column. The active patterns ACT may be doped with dopants of a first conductivity type.

At least one gate recess region 103 may intersect the active patterns ACT constituting each column. The gate recess region 103 may have a groove shape extending in the second direction D2. A depth of the gate recess region 103 may be smaller than a depth of the device isolation layer 101. In some embodiments, a pair of gate recess regions 103 may intersect the active patterns ACT constituting each column. In this case, a pair of cell transistors may be formed at each active pattern ACT.

A word line WL may be disposed in each gate recess region 103, and a gate dielectric layer 105 may be disposed between the word line WL and an inner surface of the gate recess region 103. The word line WL may have a line shape extending in the second direction D2. The cell transistor including the word line WL may include a recessed channel region due to the gate recess region 103.

A gate mask pattern 108 may be disposed on the word line WL. A top surface of the gate mask pattern 108 may be substantially coplanar with a top surface of the substrate 100.

For example, the word line WL may include at least one of a semiconductor material doped with dopants (e.g., doped silicon), metal (e.g., tungsten, aluminum, titanium, and/or tantalum), conductive metal nitride (e.g., titanium nitride, tantalum nitride, and/or tungsten nitride), and/or metal-semiconductor compound (e.g., a metal silicide).

The gate dielectric layer 105 may include at least one of an oxide (e.g., silicon oxide), a nitride (e.g., silicon nitride), an oxynitride (e.g., silicon oxynitride), and/or high-k dielectric (e.g., an insulating metal oxide such as hafnium oxide and/or aluminum oxide). The gate mask pattern 108 may include at least one of oxide (e.g., silicon oxide), nitride (e.g., silicon nitride), and/or oxynitride (e.g., silicon oxynitride).

A first doped region 111 may be disposed in each active pattern ACT at a side of the word line WL, and a second doped region 112 may be disposed in each active pattern ACT at another side of the word line WL. In some embodiments, the first doped region 111 may be disposed in each active pattern ACT between the pair of word lines WL, and a pair of second doped regions 112 may be respectively disposed in both edge regions of each active pattern ACT with the pair of word lines WL therebetween. Thus, the pair of cell transistors formed at each active pattern ACT may share the first doped region 111. The first and second doped regions 111 and 112 may correspond to source/drain regions of the cell transistor. The first and second doped regions 111 and 112 may be doped with dopants of which a second conductivity type is different from the first conductivity type of the active pattern ACT. One of the first and second conductivity types may be an N-type, and the other of the first and second conductivity types may be a P-type.

A first interlayer insulating layer 120 may be disposed on the substrate 100. The first interlayer insulating layer 120 may be formed of, for example, silicon oxide. First contact plugs 121 and second contact plugs 122 may be disposed in the first interlayer insulating layer 120 so as to be connected to the first doped regions 111 and the second doped regions 112, respectively. Each of the first and second contact plugs 121 and 122 may include at least one of a semiconductor material doped with dopants (e.g., doped silicon), metal (e.g., tungsten, aluminum, titanium, and/or tantalum), conductive metal nitride (e.g., titanium nitride, tantalum nitride, and/or tungsten nitride), and/or metal-semiconductor compound (e.g., a metal silicide). Top surfaces of the first contact plugs 121 and top surfaces of the second contact plugs 122 may be substantially coplanar with a top surface of the first interlayer insulating layer 120.

A bit line BL may be formed on the first interlayer insulating layer 120. The bit line BL may be connected in common to a plurality of the first contact plugs 121 and may extend in the first direction D1. A capping insulating layer 124 may be disposed on the first interlayer insulating layer 120 and the second contact plugs 122. In some embodiments, the capping insulating layer 124 may be formed after the formation of the bit line BL. In this case, the capping insulating layer 124 may cover the bit line BL. A portion, which covers the bit line BL, of the capping insulating layer 124 may be removed or may remain. In other embodiments, the capping insulating layer 124 may be formed before the formation of the bit line BL. In this case, at least portions, which are disposed on the first contact plugs 121, of the capping insulating layer 124 may be removed before the formation of the bit line BL.

A second interlayer insulating layer 130 may be disposed on the first interlayer insulating layer 120 to cover the bit line BL. The second interlayer insulating layer 130 may be formed of, for example, silicon oxide.

Third contact plugs 132 may sequentially penetrate the second interlayer insulating layer 130 and the capping insulating layer 124. The third contact plugs 132 may be electrically connected to the second doped regions 112 through the second contact plugs 122, respectively. In some embodiments, ohmic patterns (not shown) may be disposed between the third contact plugs 132 and the second contact plugs 122, between the second contact plugs 122 and the second doped regions 112, and between the first contact plugs 121 and the first doped regions 111. The ohmic patterns may include a metal-semiconductor compound (e.g., a metal silicide such as cobalt silicide and/or titanium silicide).

Memory elements ME may be disposed on the second interlayer insulating layer 130. Each of the memory elements ME may include a bottom electrode BE, a magnetic tunnel junction MTJ, and a top electrode TE. The magnetic tunnel junction MTJ may include a lower magnetic conductive pattern MS1 and an upper magnetic conductive pattern MS2. In some embodiments, a plurality of lower magnetic conductive patterns MS1 may have island shapes formed by a patterning process. The lower magnetic conductive patterns MS1 having the island shapes may vertically overlap with the third contact plugs 132, respectively. The upper magnetic conductive pattern MS2 and the top electrode TE may be sequentially stacked on the plurality of lower magnetic conductive patterns MS1. The upper magnetic conductive pattern MS2 and the top electrode TE may be formed by the same patterning process. The upper magnetic conductive pattern MS2 and the top electrode TE may be connected in common to the plurality of lower magnetic conductive patterns MS1 thereunder. A source line SL may be formed on the top electrode TE. The source line SL may be a plate-shaped pattern that is formed together with the upper magnetic conductive pattern MS2 and the top electrode TE by the same patterning process. In addition, as described with reference to FIGS. 15A and 15B, the tunnel barrier pattern TBL and the magnetic recovery pattern RL may be formed along with the source line SL, the upper magnetic conductive pattern MS2, and the top electrode TE by the same patterning process.

Figure 20:
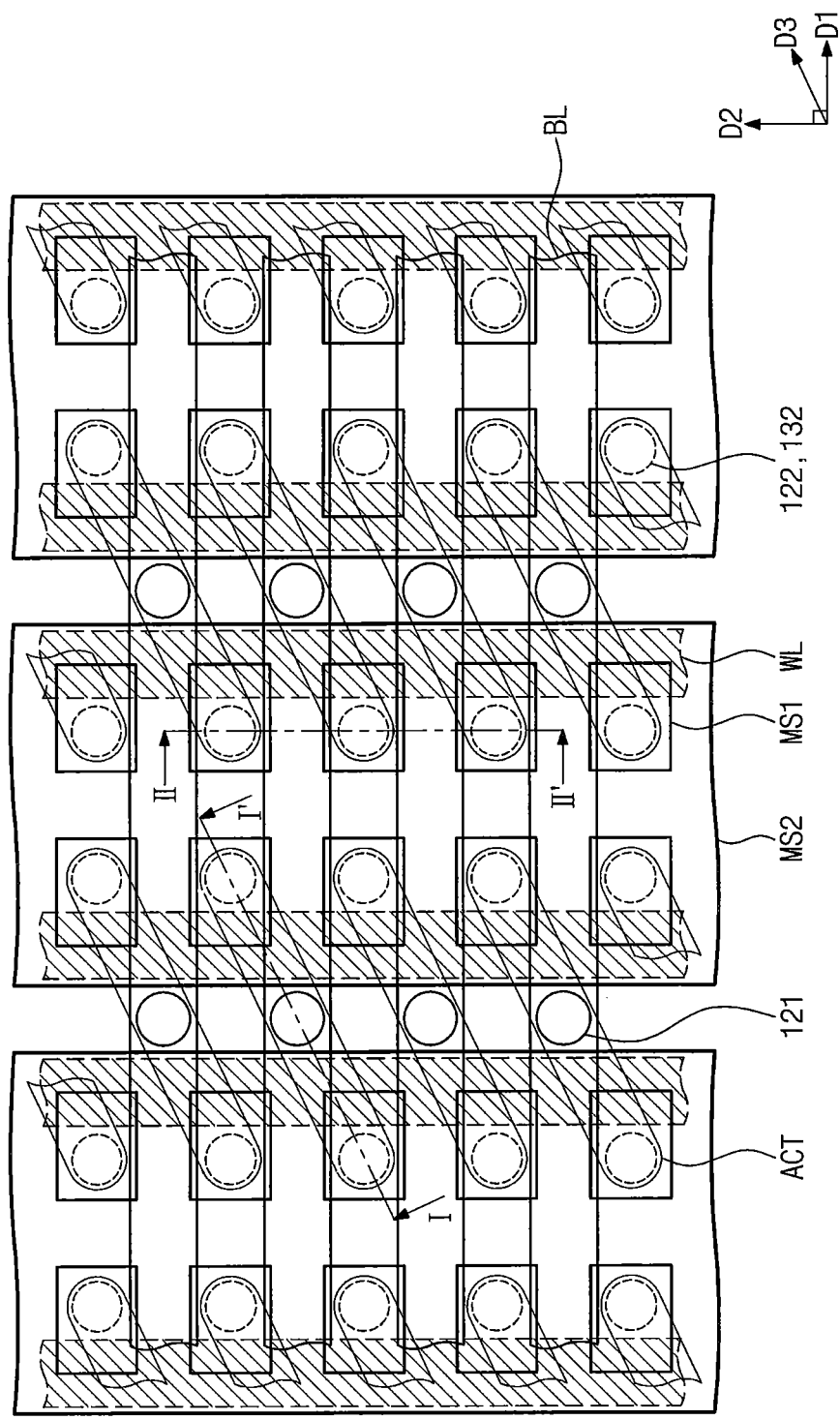
FIG. 20 is a plan view illustrating a magnetic memory device according to some other embodiments of the inventive concepts.
Figure 21:
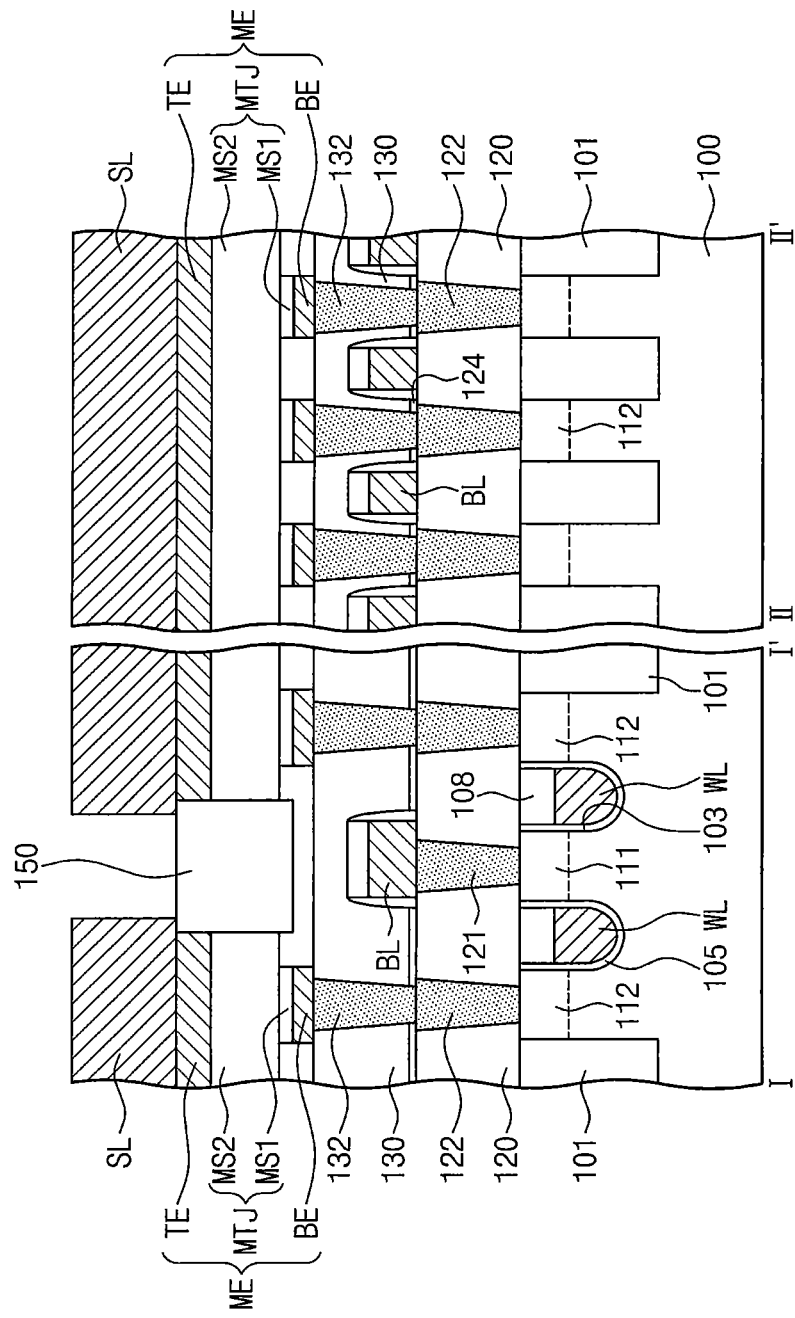
FIG. 21 is a cross-sectional view taken along lines I-I' and II-II' of FIG. 20.

FIG. 20 is a plan view illustrating a magnetic memory device according to some other embodiments of the inventive concepts, and FIG. 21 is a cross-sectional view taken along lines I-I' and II-II' of FIG. 20. In the present embodiments, the same technical features as described with reference to FIGS. 18 and 19 will be omitted or mentioned briefly for the purpose of ease and convenience in explanation.

Referring to FIGS. 20 and 21, a plurality of upper magnetic conductive patterns MS2 may extend in parallel in the second direction D2. The upper magnetic conductive patterns MS2 may be spaced apart from each other in the first direction D1. Each of the upper magnetic conductive patterns MS2 may be disposed on a plurality of lower magnetic conductive patterns MS1, and a top electrode TE may be disposed on each of the upper magnetic conductive patterns MS2. The upper magnetic conductive pattern MS2 and the top electrode TE may be formed by the same patterning process. Each upper magnetic conductive pattern MS2 and each top electrode TE may be connected in common to the plurality of lower magnetic conductive patterns MS1 disposed thereunder. Each upper magnetic conductive pattern MS2 may have a plate shape. The plurality of lower magnetic conductive patterns MS1 under each upper magnetic conductive pattern MS2 may be two-dimensionally arranged along the first and second directions D1 and D2. Source lines SL may be disposed on the top electrodes TE, respectively. In more detail, the source lines SL may extend in the second direction D2 and may be spaced apart from each other in the first direction D1. Each of the source lines SL may be connected in common to the plurality of lower magnetic conductive patterns MS1 arranged in the first and second directions D1 and D2. Each source line SL may have a plate shape. As described with reference to FIGS. 15A and 15B, the tunnel barrier pattern TBL and the magnetic recovery pattern RL may be formed along with the source line SL, the upper magnetic conductive pattern MS2, and the top electrode TE of the present embodiment by the same patterning process.

Figure 22:
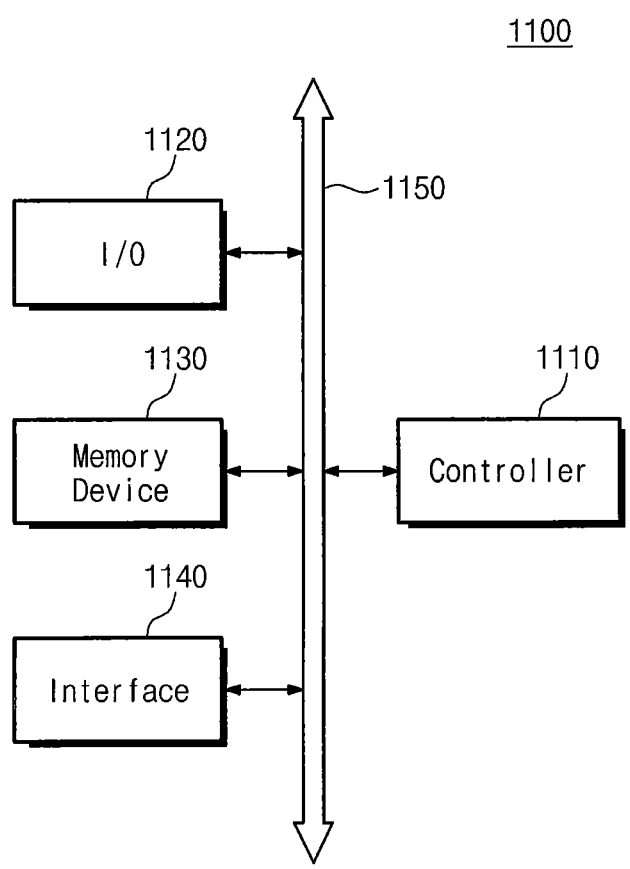
FIG. 22 is a schematic block diagram illustrating an example of an electronic system including a magnetic memory device according to some embodiments of the inventive concepts.

FIG. 22 is a schematic block diagram illustrating an example of an electronic system including a magnetic memory device according to some embodiments of the inventive concepts.

Referring to FIG. 22, an electronic system 1100 according to some embodiments of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which data (e.g., electrical signals) are transmitted. The memory device 1130 may include at least one of the magnetic memory devices according to the aforementioned embodiments of the inventive concepts.

The controller 1110 may include at least one of a microprocessor, a digital signal processor, a microcontroller, and/or other logic devices having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication and/or a transceiver for cable communication. Although not shown in the drawings, the electronic system 1100 may further include a fast dynamic random access memory (DRAM) device and/or a fast static random access memory (SRAM) device which acts as a working memory for improving an operation of the controller 1110.

The electronic system 1100 may be applied to a personal digital assistant (PDA), a portable computer, a web tablet, a wireless phone, a mobile phone, a digital music player, a memory card, and/or other electronic products receiving and/or transmitting information data by wireless.

Figure 23:
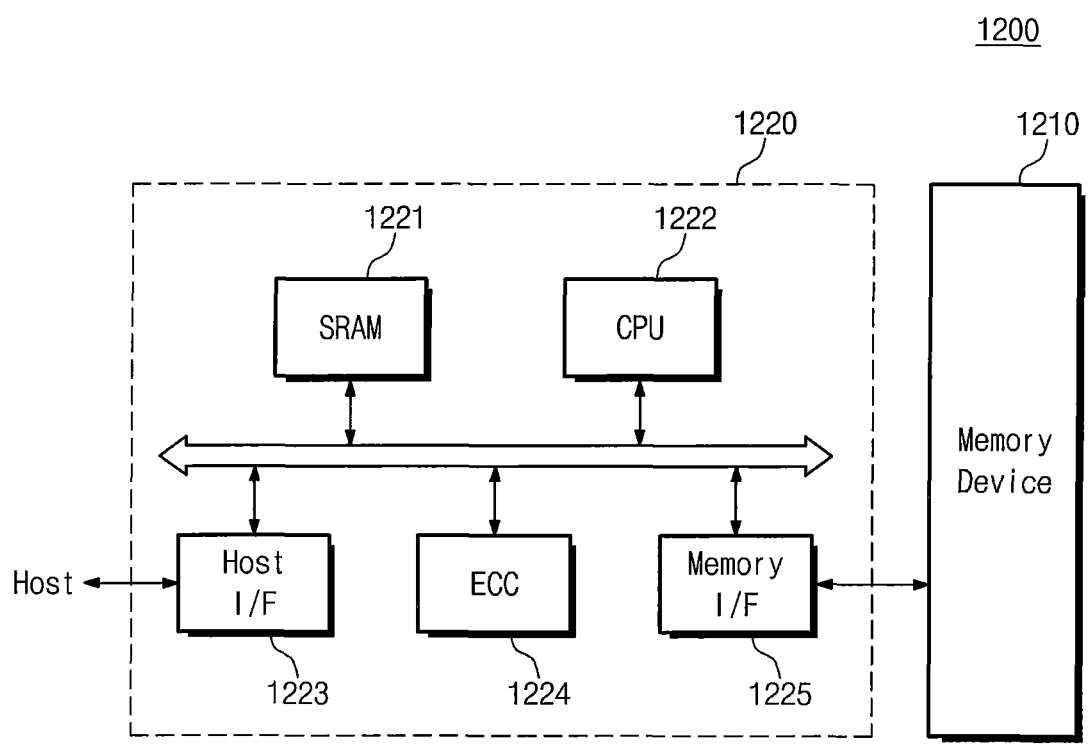
FIG. 23 is a schematic block diagram illustrating an example of a memory card including a magnetic memory device according to some embodiments of the inventive concepts.

FIG. 23 is a schematic block diagram illustrating an example of a memory card including a magnetic memory device according to some embodiments of the inventive concepts.

Referring to FIG. 23, a memory card 1200 includes a memory device 1210. The memory device 1210 may include at least one of the magnetic memory devices of the aforementioned embodiments of the inventive concepts. In addition, the memory device 1210 may further include another type of a semiconductor memory device (e.g., a DRAM device and/or a SRAM device). The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD), which are used as hard disks of computer systems.

Figure 24:
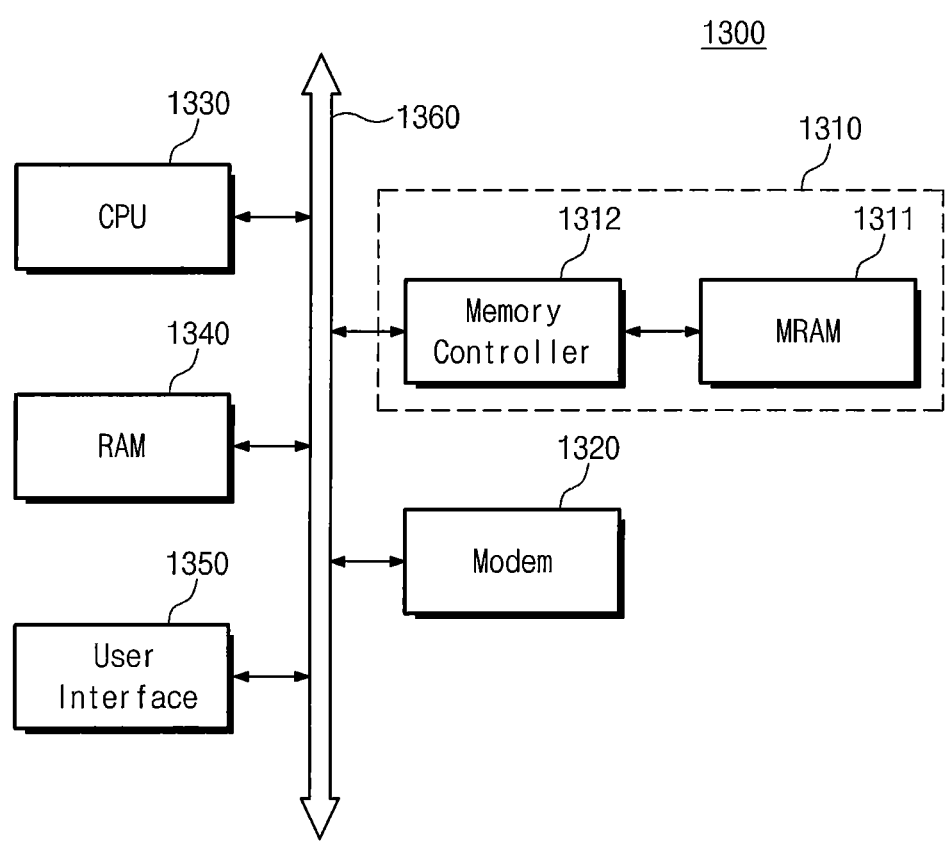
FIG. 24 is a schematic block diagram illustrating an example of an information processing systems including a magnetic memory device according to some embodiments of the inventive concepts.

FIG. 24 is a schematic block diagram illustrating an example of an information processing systems including a magnetic memory device according to some embodiments of the inventive concepts.

Referring to FIG. 24, at least one of the magnetic memory devices according to some embodiments of the inventive concepts may be installed in a memory system 1310, and the memory system 1310 may be installed in an information processing system 1300 such as a mobile device or a desk top computer. The information processing system 1300 according to the inventive concepts may include a modem 1320, a central processing unit (CPU) 1330, a random access memory (RAM) 1340, and a user interface unit 1350 that are electrically connected to the memory system 1310 through a system bus 1360. The memory system 1310 may include a memory device 1311 and a memory controller 1312 controlling overall operations of the memory device 1311. The memory system 1310 may store data processed by the CPU 1330 or data inputted from an external system. In some embodiments, the memory system 1310 may be realized as a solid state disk (SSD). In this case, the information processing system 1300 may stably store massive data into the memory system 1310. Even though not shown in the drawings, the information processing system 1300 may further include an application chipset, a camera image processor (CIS), and/or an input/output unit.

According to some embodiments of the inventive concepts, it is possible to improve the TMR ratio and the sheet resistance (RA).

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a contact plug pattern in a first interlayer dielectric layer formed on a substrate, top surfaces of the contact plug pattern and the first interlayer dielectric layer being substantially coplanar;
   a first electrode pattern on the contact plug pattern and conductively coupled to the contact plug pattern;
   a first magnetic conductive pattern on the first electrode pattern;
   a second magnetic conductive pattern on the first magnetic conductive pattern;
   a tunnel barrier pattern between the first magnetic conductive pattern and the second magnetic conductive pattern and having a first surface on which the second magnetic conductive pattern is formed and a second surface that is opposite the first surface; and
   a metal oxide layer that is on a portion of the second surface of the tunnel barrier pattern that does not contact the first magnetic conductive pattern and that is adjacent, in a direction parallel to a top surface of the substrate, a side surface of a widest portion of the first magnetic conductive pattern,
   wherein a bottom surface of the metal oxide layer is nearer the second surface of the tunnel barrier pattern than a bottom surface of the first magnetic conductive pattern.

2. The device according to claim 1, wherein the first magnetic conductive pattern comprises a first portion that includes a portion of a first magnetic layer and a second portion that includes a portion of a magnetic recovery layer.

3. A semiconductor device comprising:
   a contact plug pattern in a first interlayer dielectric layer formed on a substrate, top surfaces of the contact plug pattern and the first interlayer dielectric layer being substantially coplanar;
   a first electrode pattern on the contact plug pattern and conductively coupled to the contact plug pattern;
   a first magnetic conductive pattern on the first electrode pattern;
   a second magnetic conductive pattern on the first magnetic conductive pattern;
   a tunnel barrier pattern between the first magnetic conductive pattern and the second magnetic conductive pattern and having a first surface on which the second magnetic conductive pattern is formed and a second surface that is opposite the first surface; and
   a metal oxide layer on a portion of the second surface of the tunnel barrier pattern that does not contact the first magnetic conductive pattern and on a side surface of a widest portion of the first magnetic conductive pattern;
   wherein a bottom surface of the metal oxide layer is nearer the second surface of the tunnel barrier pattern than a bottom surface of the first magnetic conductive pattern,
   wherein the first magnetic conductive pattern comprises a first portion that includes a portion of a first magnetic layer and a second portion that includes a portion of a magnetic recovery layer, and
   wherein the magnetic recovery layer comprises a same material as the first magnetic layer and a reduced concentration of Boron (B) relative to the first magnetic layer.

4. The device according to claim 2, wherein a portion of the magnetic recovery layer comprises an insulating material.

5. The device according to claim 2, wherein the magnetic recovery layer includes a thickness in a range of about 1 Å to about 10 Å.

6. The device according to claim 2, wherein the magnetic recovery layer includes a thickness in a range of about 1 Å to about 5 Å.

7. The device according to claim 1, further comprising a second interlayer dielectric layer on the first interlayer dielectric layer,
   wherein the metal oxide layer is on the second interlayer dielectric layer and includes an oxide of a magnetic conductive layer, and
   wherein the second interlayer dielectric layer includes a non-metallic oxide, a non-metallic nitride and/or a non-metallic oxynitride.

8. The device according to claim 7, wherein the non-metallic oxide, the non-metallic nitride and/or the non-metallic oxynitride comprise silicon oxide, silicon nitride and/or silicon oxynitride.

9. The device according to claim 1, further comprising a second electrode pattern on the second magnetic conductive pattern, wherein widths of the second electrode pattern, the second magnetic conductive pattern and the tunnel barrier pattern are greater than widths of the first electrode pattern and the first magnetic conductive pattern.

10. The device according to claim 1, further comprising an insulating spacer on side walls of the first electrode pattern and the first magnetic conductive pattern.

11. The device according to claim 1, further comprising a second interlayer dielectric layer on the first interlayer dielectric layer,
wherein a portion of the second interlayer dielectric layer is between the bottom surface of the first magnetic conductive pattern and the bottom surface of the metal oxide layer.

12. The device according to claim 11, wherein the second interlayer dielectric layer contacts a sidewall of the first magnetic conductive pattern.

13. The device according to claim 2, wherein the portion of the magnetic recovery layer extends along a top surface of the first magnetic conductive pattern.

14. The device according to claim 1, wherein the first magnetic conductive pattern has a changeable magnetization direction.

15. The device according to claim 3, wherein a portion of the magnetic recovery layer comprises an insulating material.

16. The device according to claim 3, wherein the magnetic recovery layer has a thickness in a range of about 1 Å to about 10 Å.

17. The device according to claim 3, further comprising a second interlayer dielectric layer on the first interlayer dielectric layer,
wherein the metal oxide layer is on the second interlayer dielectric layer and includes an oxide of a magnetic conductive layer, and
wherein the second interlayer dielectric layer includes a non-metallic oxide, a non-metallic nitride and/or a non-metallic oxynitride.

18. The device according to claim 17, wherein the non-metallic oxide, the non-metallic nitride and/or the non-metallic oxynitride comprise silicon oxide, silicon nitride and/or silicon oxynitride.

19. The device according to claim 3, further comprising a second electrode pattern on the second magnetic conductive pattern,
wherein widths of the second electrode pattern, the second magnetic conductive pattern and the tunnel barrier pattern are greater than widths of the first electrode pattern and the first magnetic conductive pattern.

20. The device according to claim 3, further comprising a second interlayer dielectric layer on the first interlayer dielectric layer,
wherein a portion of the second interlayer dielectric layer is between the bottom surface of the first magnetic conductive pattern and the bottom surface of the metal oxide layer, and
wherein the second interlayer dielectric layer contacts a sidewall of the first magnetic conductive pattern.

* * * * *